(12) United States Patent
Doynov

(10) Patent No.: US 12,140,635 B1
(45) Date of Patent: Nov. 12, 2024

(54) METHODS AND SYSTEMS FOR STATUS MONITORING OF TRANSIENT ELECTROMAGNETIC SURGE PROTECTION DEVICES

(71) Applicant: EMP Shield Inc., Burlington, KS (US)

(72) Inventor: Plamen Doynov, Kansas City, MO (US)

(73) Assignee: EMP Shield Inc., Burlington, KS (US)

( * ) Notice: Subject to any disclaimer, the term of this patent is extended or adjusted under 35 U.S.C. 154(b) by 0 days.

(21) Appl. No.: 18/614,391

(22) Filed: Mar. 22, 2024

(51) Int. Cl.
*G01R 31/327* (2006.01)

(52) U.S. Cl.
CPC ................. *G01R 31/3275* (2013.01)

(58) Field of Classification Search
None
See application file for complete search history.

(56) References Cited

U.S. PATENT DOCUMENTS

| | | | | |
|---|---|---|---|---|
| 11,469,592 B1* | 10/2022 | Doynov | ............ | H02H 5/00 |
| 2021/0006064 A1* | 1/2021 | Janik | ............ | H02H 9/005 |
| 2021/0305808 A1* | 9/2021 | Doynov | ............ | H02H 9/005 |
| 2022/0224108 A1* | 7/2022 | Doynov | ............ | H02H 5/00 |

* cited by examiner

*Primary Examiner* — Nasima Monsur
(74) *Attorney, Agent, or Firm* — Fresh IP PLC; John R. Bednarz

(57) ABSTRACT

A method and system for status monitoring of transient surge protection devices may display operational status and instantaneously a fault condition of a surge protection device (SPD) induced by transient electromagnetic energy disturbance from high altitude nuclear weapon detonation generating an electromagnetic pulse (EMP), Geo-magnetic disturbance (GMD), solar corona mass ejection (CME), intentional electromagnetic interference (IEMI), natural lightning strikes, or other transient surges due to radiated and conducted EMI. The system monitors operational status and readiness of SPDs installed on electric power networks to protect devices powered by the networks. The status monitoring of SPD has local display and cybersecure, over-the-power-lines communication (OPLC), implemented with analog circuits and instantaneous response. The system comprises embedded self-testing and diagnosis of surge protection assemblies with test data collection and ML/AI algorithms for preventive maintenance of distributed SPDs, protecting AC and DC installations on primary power distribution networks, mini grids, and backup power systems.

19 Claims, 17 Drawing Sheets

35

| Standard Parameter | Bell Labs (1960s) DEXP | IEC-77C (1993) DEXP | Leuthauser (1994) QEXP | VG95371-10 (1995) DEXP | IEC 61000-2-9 (1996) DEXP |
|---|---|---|---|---|---|
| t10%-90% | 4.6 ns | 2.5 ns | 1.9 ns | 0.9 ns | 2.5 ns |
| Peak Field $E_0$ | 50 kV/m | 50 kV/m | 60 kV/m | 65 kV/m | 50 kV/m |
| FWHM | 18.4 ns | 23 ns | 23.8 ns | 24.1 ns | 23 ns |
| constant | 1.05 | 1.3 | 1.08 | 1.085 | 1.3 |
| α (1/sec) | $4 \times 10^6$ | $4 \times 10^7$ | $2.20 \times 10^9$ | $3.22 \times 10^7$ | $4 \times 10^7$ |
| β (1/sec) | $4.76 \times 10^8$ | $6 \times 10^8$ | $3.24 \times 10^7$ | $2.07 \times 10^9$ | $6 \times 10^8$ |
| Energy Density | 0.891 J/m² | 0.114 J/m² | 0.167 J/m² | 0.196 J/m² | 0.114 J/m² |

| Waveform parameter | First return stroke | Subsequent strokes |
|---|---|---|
| Average 10%-90% rise time | 14.5 μs | 17.4 μs |
| Average 10%-10% duration time | 244.6 μs | 83.2 μs |
| Average maximum voltage gradient | 0.55 kV/μs | 0.35 kV/μs |
| Average 10%-90% rise time of first peak | 6.9 μs | 5.0 μs |
| Average interval between first and maximum peak | 11.2 μs | 14.6 μs |

FIG. 8

METHODS AND SYSTEMS FOR STATUS MONITORING OF TRANSIENT ELECTROMAGNETIC SURGE PROTECTION DEVICES

FIELD

The systems and methods relate to persistent monitoring and displaying in real time a status of surge protection devices built to prevent impending damaging effects of excessive transient electromagnetic energy on electrical and communication networks and to protect connected electrical and electronic systems from damage.

BACKGROUND

Electromagnetic energy (EM) surges are phenomena where over-voltages and currents exceeding the normal operational range occur for a short period of time. The sources of powerful surges are electrical grid circuit switching, natural lightning strikes, electromagnetic interference (EMI) coupling, electrostatic discharge (ESD), nuclear electromagnetic pulses (NEMP), non-nuclear EMP (NNEMP) based on high-power electromagnetic (HPEM) sources, narrow, wide, and ultra-wide band directed energy weapons (DEW) sources, intentional EMI such as jamming, and geo-magnetic disturbance (GMD), as summarized in block-diagram 5 in FIG. 1. The sources based on natural phenomena or technology-based sources for intentional EMI (IEMI) can impose devastating effects on electrical and electronic infrastructure. To prevent or minimize the damage due to electromagnetic disturbance, proper design and installation of EMI protection and grounding system is essential to suppress the hazardous effect of a surge, absorb the energy, and/or redirect the energy to ground.

The term electromagnetic pulse (EMP) is used to describe a transient burst of electromagnetic (EM) energy and the associated electromagnetic disturbances due to energy coupling to conductive surfaces and lines. In this document, the term "EMP" is used to describe the electromagnetic fields generated by natural or manmade sources. Frequently, the term High-altitude Nuclear EMP (HNEMP) is also used. The terms "EMP" or "HEMP" as used herein refer to the electromagnetic pulse generated by a nuclear bomb detonation, a directed energy system for high-power EM generation, other devices for IEMI or natural EMP events as a result from a Coronal Mass Ejection (CME), supernova explosion, and other cosmic phenomenon resulting in Geo-magnetic Disturbance (GMD) and large scale EMP effects.

In the time domain, the EMP is presented with a waveform that describes how the amplitude of the pulse changes in time. Several specific parameters correlate the waveform to the intensity of the EMP. The real EM pulses tend to vary and to be quite complex, so their simplified descriptions are typically characterized by:

The type of EM energy coupling-radiated EM (direction of propagation, polarization, etc.), conducted, electric, magnetic, etc.

Pulse waveform: shape (rise and fall time), pulse width at half maximum (PWHM), duration, and peak amplitude.

The range or spectrum of frequencies present and the power spectrum distribution (in frequency domain).

These interdependent characteristics define a range of impending damaging effects of excessive transient electromagnetic energy of EMP.

It is with these issues in mind, among others, that various aspects of the disclosure were conceived.

SUMMARY

The methods and systems described in this application monitor and display in real time the operational status of devices installed on electrical infrastructure networks to protect the connected electrical and electronic systems from damage. In doing so, the methods and systems enhance critical infrastructure resilience and persistent protection readiness. In brief, this disclosure describes, among other things, a system and method for enhanced protection of electrical and electronic systems from electromagnetic pulse-induced electrical transient surges induced by the E1, E2, and E3 components of an electromagnetic radiation complex multi-pulse, generated by the detonation of a nuclear weapon at high altitude (HEMP), intentional electromagnetic interference (IEMI), natural lightning strikes, a Geo-magnetic disturbance (GMD) produced by a coronal mass ejection (CME), or other transient surges due to radiated and conducted electromagnetic interference (EMI).

In one aspect, the methods and systems for status monitoring of transient electromagnetic surge protection devices (SPDs) are cognizant that modern protecting devices are designed and built with surge protection components for limiting, absorbing, switching, and shunting excessive electromagnetic energy. The SPDs are described as Types by UL and Categories by IEEE depending on their intended installation allocation. The components used for SPDs have different parameters and functional characteristics to provide solutions to the broad range of pluralities of EMPs from natural and technology-based sources as listed in FIG. 1. They comprise limiting, absorbing, switching, and shunting assemblies including transient voltage suppressors (TVSs), metal oxide varistors (MOVs), gas discharge tubes (GDTs), glass GDTs, avalanche diodes (ADs), avalanche transistors (ATs), spark gap protectors (SPG) and thyristor surge suppressors (TSS), solid state switches, other solid state and nonlinear components based on semiconductors (i.e., Si, Ge), compound semiconductors (i.e., SiC, GaN, GaAs), mechanical, electrical, and ionization discharge devices (IDDs) as bulk components, distributed metamaterials, and combinations thereof.

In another aspect, the methods and systems for status monitoring of transient electromagnetic SPDs recognize that the devices used for limiting, absorbing, switching, and shunting are designed to withstand high magnitude voltage and current transients without interfering with the normal operation of the protected electrical networks. The disclosure is based on understanding that to address the complexity of EM energy coupling to different components of infrastructure, different categories transient protection devices are used in combinations to form a hybrid approach to EMP protection. The allowable voltage amplitude levels of the protecting assemblies are selected and combined to achieve a predefined desired response time and protection level capacity to react to and mitigate the E1, E2, and E3 components of a complex multi-phase EMP generated by detonation of a nuclear weapon at high altitude (NHEMP). In a similar aspect, the response time and the voltage limiting and energy handling capacity of the plurality of inline embedded protecting assemblies responds to electromagnetic energy surges induced by a GMD, IEMI, or other EMI events.

In another aspect, the methods and systems provide solutions to the persistent protection readiness status of installed SPDs which is essential for providing continuous resilience to natural and technology-based surges. Due to the immense stress to the SPDs from transient over voltages, there is associated undesirable changes of the characteristics of the surge protection components and their energy handling capacity degrades with time and number of transients. Preventing excessive current draw, overheating, and fire hazard has led to the requirements for surge protection installation in series configuration after a fuse or circuit breaker. However, disconnecting the protected electrical loads is not acceptable in many critical operations. The continuous monitoring and displaying in real time the operational status of the SPDs is a viable and proven necessity for providing a timely response and preventive maintenance of protective transient surge measures and continuity of operations.

In a further aspect, the presented methods and systems provide surge protection of AC and DC power networks with persistent operational status monitoring with local displaying and cybersecure, including over the power lines instantaneous remote notification of status. These and other aspects, features, and benefits of the present disclosure will become apparent from the following detailed written description of the preferred embodiments and aspects taken in conjunction with the following drawings, although variations and modifications thereto may be affected without departing from the spirit and scope of the novel concepts of the disclosure.

BRIEF DESCRIPTION OF THE DRAWINGS

The accompanying drawings illustrate embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 7 is a table with the parameter values for the HEMP E1 waveform and their changes as the models and standards describing the HEMP E1 environment have evolved according to an example of the instant disclosure.

FIG. 8 is a table of lightning strikes waveform characteristics according to an example of the instant disclosure.

DETAILED DESCRIPTION

Figure 1:
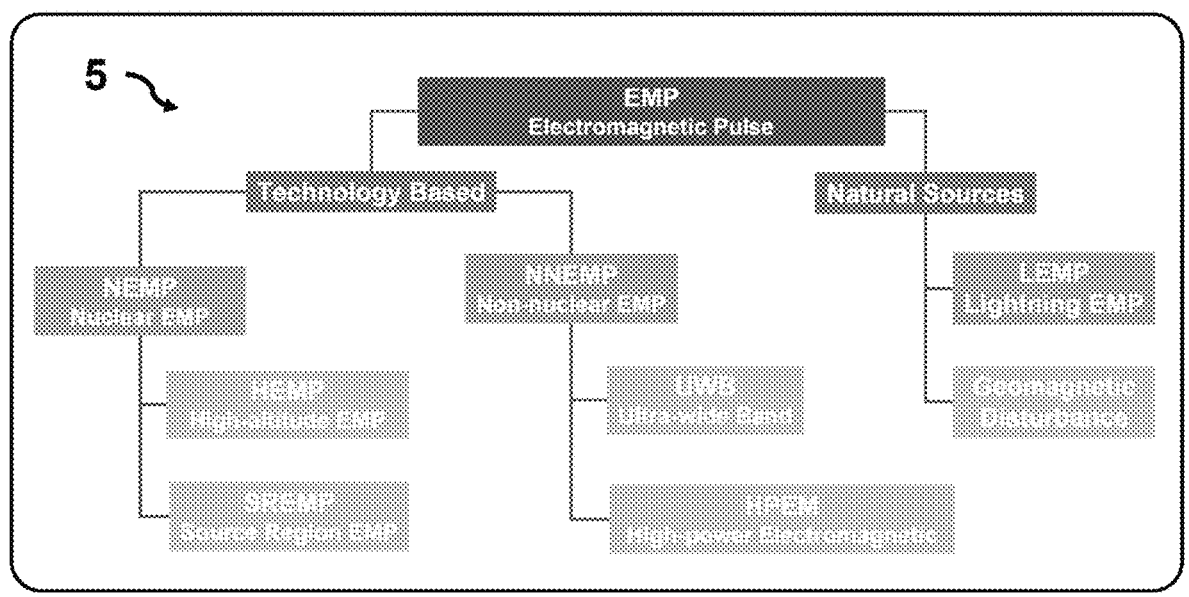
FIG. 1 is a view diagram of the sources of powerful electromagnetic surges, referred to as electromagnetic pulse (EMP), such as electrical grid circuit switching, natural lightning strikes (LEMP), technology based electromagnetic interference (EMI) coupling, electrostatic discharge (ESD), directed energy weapons (DEW) sources, nuclear electromagnetic pulses (NEMP), non-nuclear EMP, and geo-magnetic disturbance (GMD) according to an example of the instant disclosure.

The present invention is more fully described below with reference to the accompanying figures. The following description is exemplary in that several embodiments are described (e.g., by use of the terms "preferably," "for example," or "in one embodiment"); however, such should not be viewed as limiting or as setting forth the only embodiments of the present invention, as the invention encompasses other embodiments not specifically recited in this description, including alternatives, modifications, and equivalents within the spirit and scope of the invention. Further, the use of the terms "invention," "present invention," "embodiment," and similar terms throughout the description are used broadly and not intended to mean that the invention requires, or is limited to, any particular aspect being described or that such description is the only manner in which the invention may be made or used. Additionally, the invention may be described in the context of specific applications; however, the invention may be used in a variety of applications not specifically described.

The embodiment(s) described, and references in the specification to "one embodiment", "an embodiment", "an example embodiment", etc., indicate that the embodiment(s) described may include a particular feature, structure, or characteristic. Such phrases are not necessarily referring to the same embodiment. When a particular feature, structure, or characteristic is described in connection with an embodiment, persons skilled in the art may affect such feature, structure, or characteristic in connection with other embodiments whether or not explicitly described.

In the several figures, like reference numerals may be used for like elements having like functions even in different drawings. The embodiments described, and their detailed construction and elements, are merely provided to assist in a comprehensive understanding of the invention. Thus, it is apparent that the present invention can be carried out in a variety of ways and does not require any of the specific features described herein. Also, well-known functions or constructions are not described in detail since they would obscure the invention with unnecessary detail. Any signal arrows in the drawings/figures and labeled components should be considered only as exemplary, and not limiting or exhaustive, unless otherwise specifically noted. Further, the description is not to be taken in a limiting sense but is made merely for the purpose of illustrating the general principles of the invention, since the scope of the invention is best defined by the appended claims.

It will be understood that, although the terms "first," "second," etc., as well as "primary", "secondary," etc., may be used herein to describe various elements, these elements should not be limited by these terms. These terms are only used to distinguish one element from another. Purely as a non-limiting example, a first element could be termed a second element, and, similarly, a second element could be termed a first element, without departing from the scope of example embodiments. As used herein, the term "and/or" includes any and all combinations of one or more of the associated listed items. As used herein, the singular forms "a", "an," and "the" are intended to include the plural forms as well, unless the context clearly indicates otherwise. It should also be noted that, in some alternative implementations, the functions and/or acts noted may occur out of the order as represented in at least one of the several figures. Purely as a non-limiting example, two figures shown in succession may in fact be executed substantially concurrently or may sometimes be executed in the reverse order, depending upon the functionality and/or acts described or depicted.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

The characteristics of an electromagnetic pulse (EMP), in general, and high-altitude nuclear EMP (HNEMP), in particular, depend on the source and must be considered in the context of traditional electrical environments and setups before being described in detail and in regard to protection of electrical and electronic systems. Electromagnetic energy (EM) surges are phenomena where over-voltages and current "spikes" exceeding the normal operational range occur for a short period of time. To prevent or minimize the damage due to electromagnetic disturbance, proper design and installation of an EMI protection and grounding system is essential to suppress the hazardous effect of a surge, absorb the energy, and/or redirect the energy to ground. FIGS. 1 to 8 are included to supplement the description of the physical phenomena that result in the extreme intensity of high altitude EMP and its broadband frequency content, as shown in the figures and tables. It is shown that part of an NEMP resembles the characteristics of frequently occurring natural lightning strikes, and others are reminiscent to GMD events. The man-made directed energy sources for intentional EMI have capabilities to generate more complex waveforms in time domain and variations of spectral content and distribution.

Looking to FIG. 1, block-diagram 5 summarizes EM pulses from natural sources or technology-based sources for intentional EMI (IEMI) capable of imposing devastating effects on electrical and electronic infrastructure.

Figure 2:
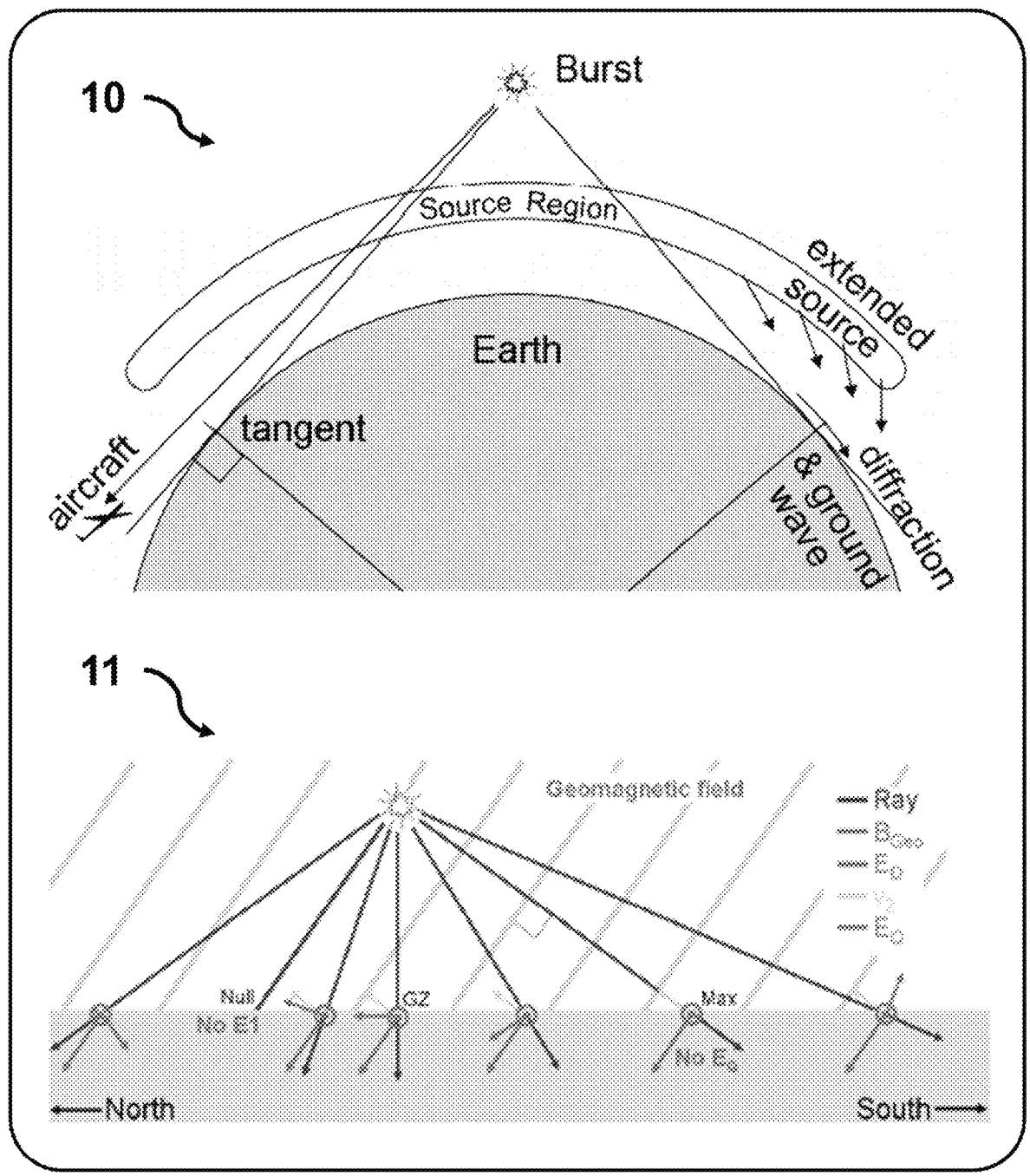
FIG. 2 is a pictograph of an electromagnetic pulse generated by a high-altitude nuclear explosion (HEMP) and the formation of the Source region in the atmosphere according to an example of the instant disclosure.

Looking to FIG. 2, pictograph 10 shows an electromagnetic pulse formation generated by a high-altitude nuclear explosion in the atmosphere at high altitude according to an example of the instant disclosure. The directional wave propagation towards the Earth's surface with the electric and magnetic components is illustrated by pictograph 11 according to an example of the instant disclosure.

Figure 3:
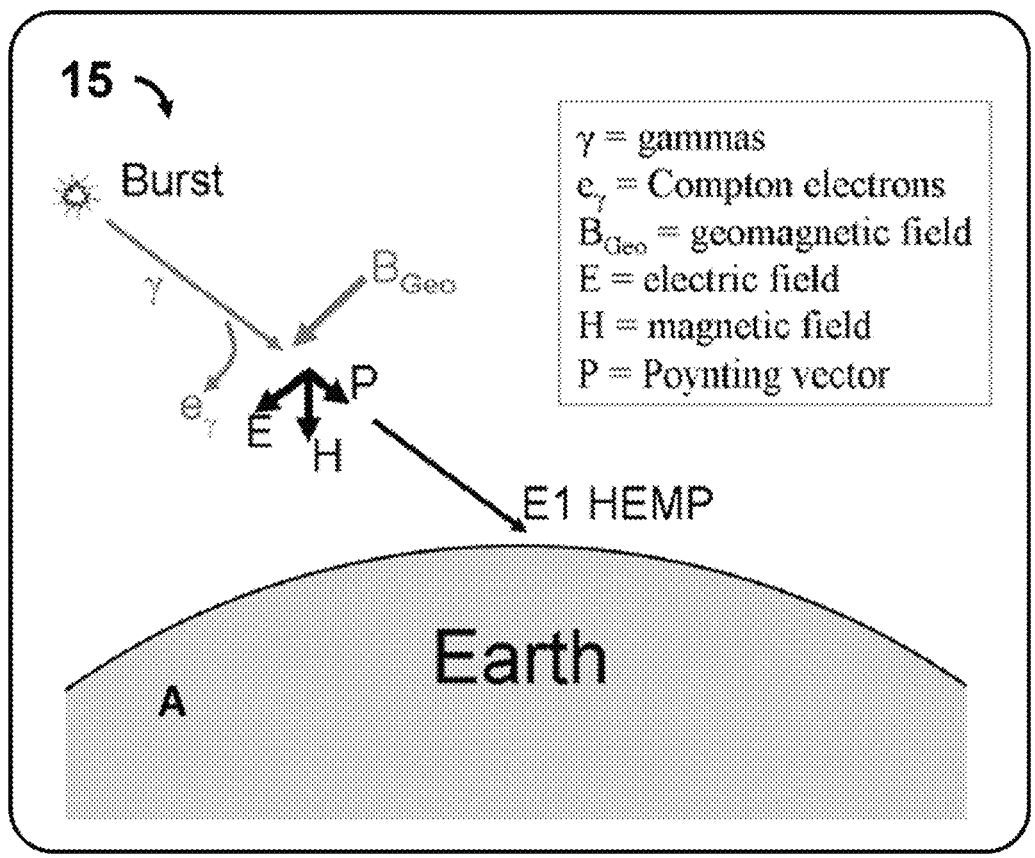
FIG. 3 is a pictograph of a nuclear burst high-altitude location and the Electro-magnetic Field (EMF) Poynting vector direction with respect to the observer's location according to an example of the instant disclosure.

Looking to FIG. 3, the current understanding of high-altitude nuclear EMP is presented formed on the interactions of the blast-generated high-energy gamma rays with atoms in the atmosphere that produce electrons which interact with the Geo-magnetic field. The produced EM field with a Poynting vector from the burst source towards the Earth's surface is shown with pictograph 15, according to an example of the instant disclosure. The field generated by a high-altitude EMP (HEMP) has direction variation along a north-south central line and over the horizon extended effects, as illustrated with the Electromagnetic Field (EMF) Poynting vector direction with respect to the observer's location. The intensity of the pulse varies by location (latitude) due to the Geo-magnetic field distribution. Some additional relevant factors will be discussed further while the detailed specifics of the related physical phenomena are beyond the scope of this application.

Figure 4:
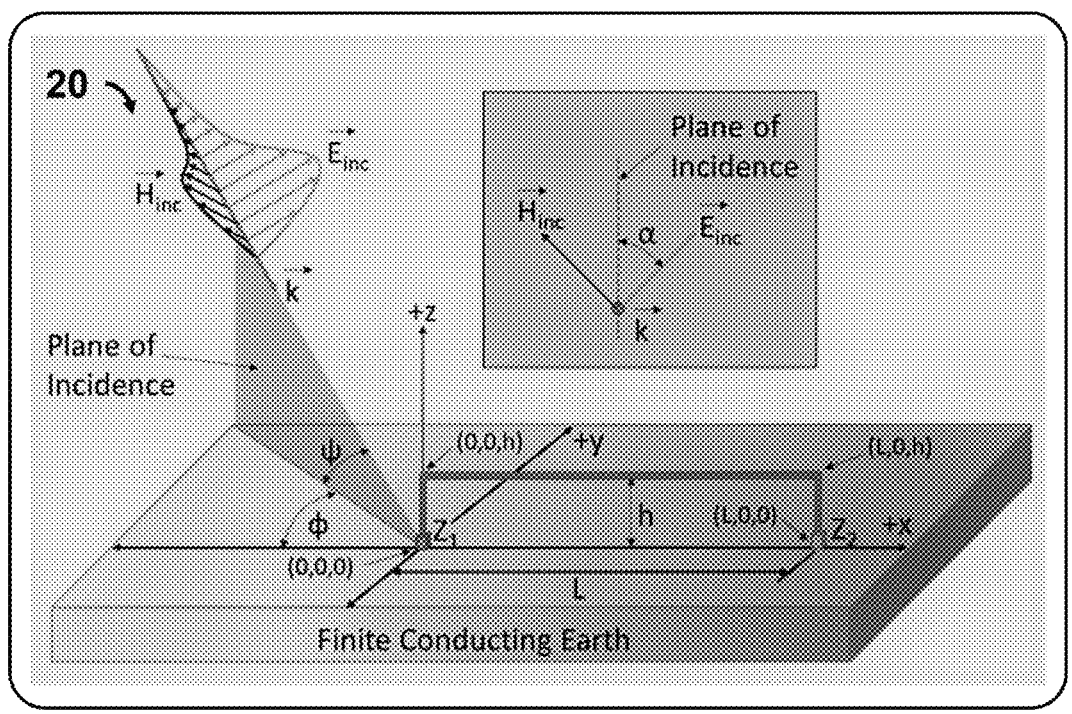
FIG. 4 illustrates the EM wave and its E (electric) and H (magnetic) vectors in the plane of incidence at a transmission wire at height h above the ground surface. The three associated angles ($\alpha$, $\phi$, and $\psi$) are indicative for the importance of the special configuration with respect to Electromagnetic field (EMF) susceptibility according to an example of the instant disclosure.

Looking to FIG. 4, pictograph 20 illustrates the coupling of the EM energy into a transmission line at height h above the ground (Earth's surface) according to an example of the instant disclosure. The pictograph displays a few key relations of the Electric field (E) and Magnetic field (B) using the Half-space Earth model. The image is from "The Early-time (E1) HEMP and its impact on the US Power Grid" report, written in 2010 by Savage et al., Metatech Corp., and provides an excellent analysis of the physical phenomena associated with the HEMP.

An EMP event can induce voltages and corresponding currents into multiple and different electrical systems. The voltage/current magnitudes depend on the coupling of the EM field with the system (its susceptibility) and the characteristics of the EM wave (direction, polarization, frequency content, and others). The long and exposed transmission lines of wide-area power distribution grids, as well as the electrical systems of localized mini-grids, renewable energy systems, communication lines, homes' wiring, commercial buildings, and even vehicle electrical systems.

Without proper protection measures, over-voltage surges can disturb, damage, or destroy components within the electrical systems in the area of impact, diminishing the operability of the electrical system or rendering it unusable until repaired. Persistent and successful protection is possible only with implementation of adequate surge shielding (e.g., Faraday cage) and/or methods for surge limiting and energy redirection and absorbing. For example, multiple methods and tools are developed and used for surge protection from EM energy associated with lightning. While the duration of a lightning strike appears very short (microseconds, $\mu s$, or $10^{-6}$ s), it is orders of magnitude longer than the duration of what is known in the literature as the E1 HEMP, which is order of nanoseconds, (ns, or $10^{-9}$ s). As shown in FIG. 2, due to its origin, a HEMP will induce effects in a very large area. Similarly, it is understood that a massive solar coronal mass ejection (CME) reaching the Earth results in GMD which has damaging effects on electrical infrastructure.

Figure 5:
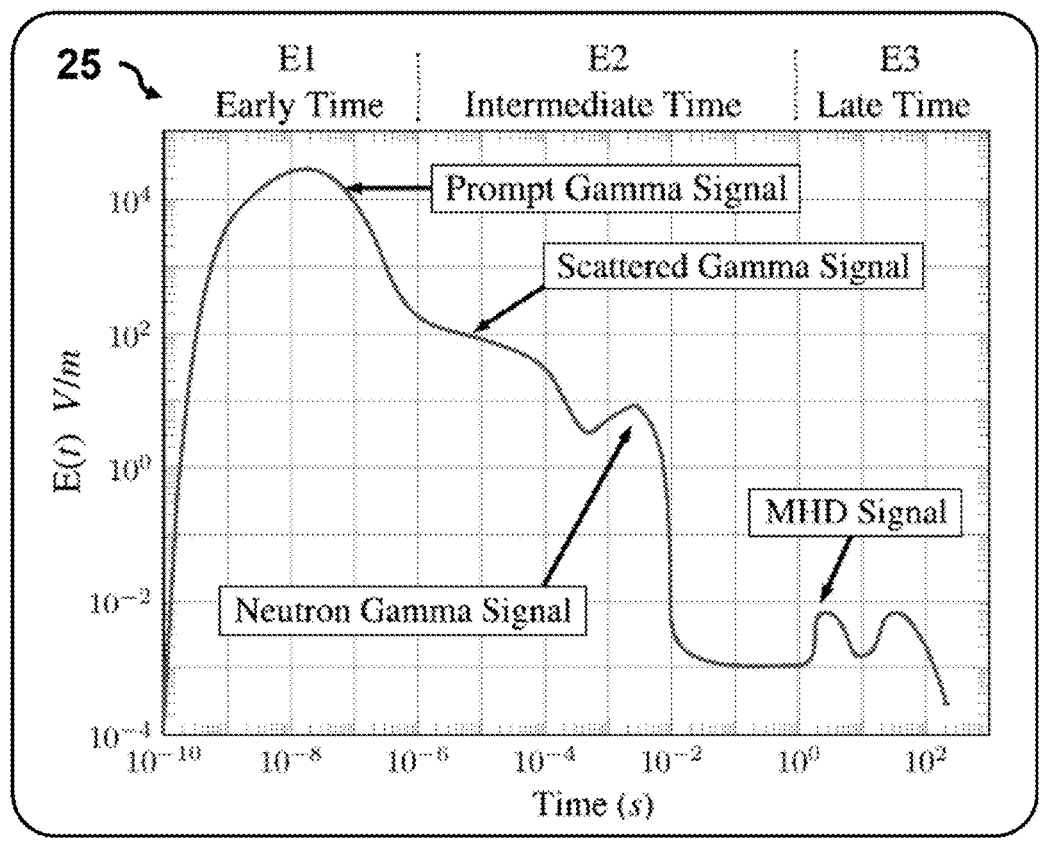
FIG. 5 is a plot representation in time domain of the complex high-altitude electromagnetic multi-pulse event with a sequence of three E1, E2, and E3 phases of the HEMP according to an example of the instant disclosure.

Looking to FIG. 5, plot 25 presents HEMP with several stages in time following the nuclear blast. The stages are also known as Early time, Intermediate time, and End time phases or pulses of varying waveform (magnitude, duration, frequency content, etc.) Unlike the electromagnetic radiation or transient pulses associated with common natural phenomena (lighting strikes, solar storms reaching the Earth) and industrial transmission lines overvoltage and overcurrent surges, the HEMP comprises of more complex time and frequency domain characteristics. Therefore, the HEMP is more accurately considered as a complex, electromagnetic multi-pulse event, usually described in terms of sequence of three primary components defined by the International Electrotechnical Commission (IEC) as E1, E2, and E3 phases of the high-altitude EMP (HEMP). The characteristics of these phases (pulses) of HEMP are further described in this application. The relative electric field strength of the time sequence is displayed in plot 25 using a logarithmic scale for the electric field strength E (V/m) vs Time(s), according to an example of the instant disclosure.

Figure 6:
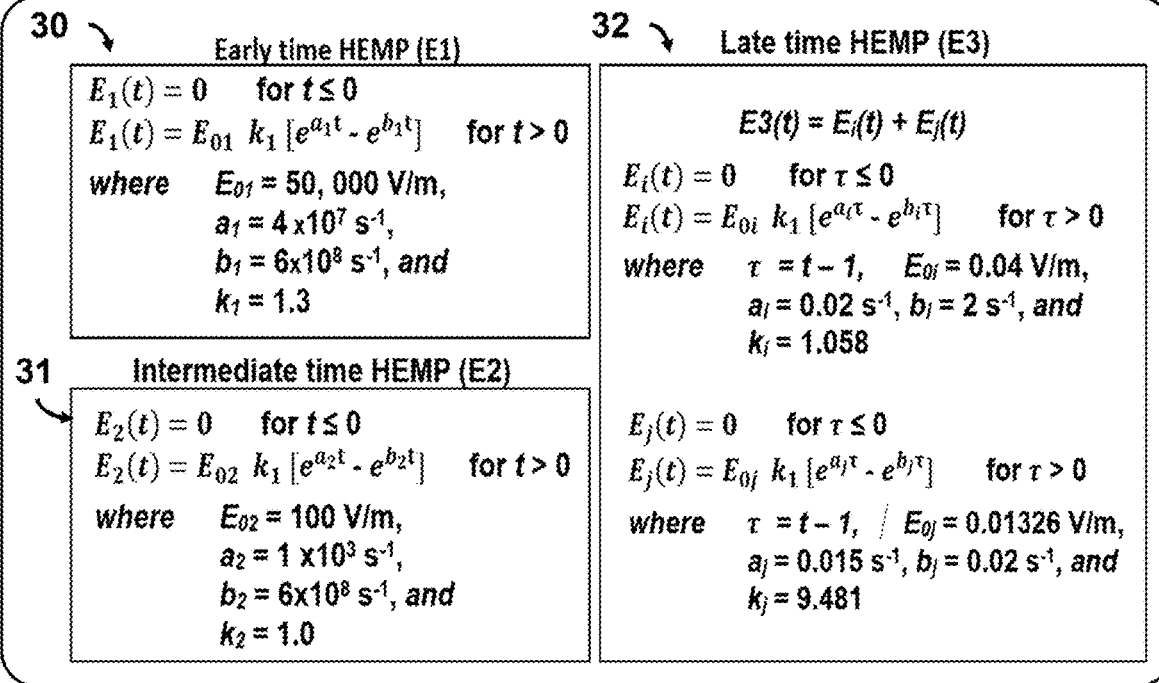
FIG. 6 is a tabulated summary of the commonly used analytical expressions for the HEMP E1, E2, and E3 waveforms with the model parameter values according to an example of the instant disclosure.

Looking to FIG. 6, some of the commonly used analytical expressions for the HEMP E1, E2, and E3 waveforms are given with groups 30, 31 and 32 of analytical expressions and coefficients. The accepted values for the variables and coefficients in the analytical expressions are also given according to an example of instant disclosure.

The E1 component of the complex multi-pulse is produced when gamma radiation from the nuclear detonation knocks electrons out of the atoms in the upper atmosphere. The electrons begin to travel in a generally downward direction at relativistic speeds (e.g., at more than 80-90 percent of the speed of light, depending on nuclear blast altitude, atmospheric conditions, geolocation, etc.). In the absence of a magnetic field, the displaced electrons would produce a large pulse of electric current in the upper atmosphere over the entire affected area. However, the Earth's magnetic field acts on the electrons and changes the direction of electron flow so that it is at a right angle to the geomagnetic field. This interaction of the Earth's magnetic field on the downward electron flow produces a very brief, but very high magnitude, electromagnetic pulse over the affected area.

The process of gamma rays knocking electrons from the atoms in the mid-stratosphere ionizes that region, causing it to become an electrically conductive ionized layer, that limits and blocks the further expansion of the electromagnetic signals and causing the field strength to saturate at about 50,000 volts per meter (50 kV/m). The strength of the E1 HEMP depends upon the altitude of the detonation of the nuclear device and the atmosphere conditions, and the intensity of the gamma rays produced by the weapon. More detailed explanations of the undergoing physical interactions are beyond the scope of this document and may be found elsewhere.

The interaction of the very rapidly moving negatively charged electrons with the magnetic field radiates a short duration, intense pulse of electromagnetic energy. The pulse typically rises to its peak magnitude in about five nanoseconds (5 ns) and decays within hundreds of nanoseconds (200 ns-500 ns, depending on the level of intensity used for measurement). The given values may vary based on location and distance to the blast point. According to the most recent IEC standard update, the E1 pulse has a rise time of 2.5 ns±0.5 ns (from 10% to 90% amplitude levels), reaches peak value of 50 kV/m in 5 ns, and has a pulse width at half maximum of 23 ns±5 ns. The analytical expressions and accepted values for HEMP E1, E2, and E3 are respectively summarized in 30, 31, and 32 in FIG. 6.

Thus, the E1 component is a short-duration, intense electromagnetic pulse capable of inducing very high voltages in electrical conductors. That induced high voltage typically exceeds the breakdown voltage of common electrical system components such as those used in computers and communications equipment, degrading and/or destroying those components. Because the E1 component pulse occurs so quickly, most commonly available lightning surge protectors are unable to respond and suppress the surge induced into an electrical system by an E1 pulse.

Any EMP is associated with electromagnetic interference (EMI) which is related to the frequency content and spectral distribution and is classified as "narrowband", "wideband" and "ultrawideband" distributed in different frequency ranges. The frequency spectrum and the pulse waveform in time domain are interrelated analytically via the Fourier transform and other mathematical transformations for joint time-frequency representation (wavelets, spectrograms, etc.). An EMP typically contains energy at many frequencies from direct current (DC) to some upper limit depending on the source. Within the bandwidth, there could be multiple spectral peaks with high magnitudes. In general, the shorter the pulse (which also implies a short rise time), the broader the spread over a range of frequencies. The commonly used first-order approximation is $f_h = 0.34/\tau_r$, where $f_h$ is the high frequency range (Hz) and $\tau_r$ is the rise time (sec) of the pulse peak amplitude (elapsed time from 10% to 90% of pulse rising edge).

Looking to FIG. 7, table 35 presents the evolution of the HEMP E1 waveform model. Starting in the 1960s, multiple waveform models have been developed to establish standards for testing the effects and the associated hazardous effects. The series of standards related to the description of the associated waveforms are known as IEC 77C Standards. The evolution of the unclassified standards with respect to the E1 HEMP environment can be seen in Table 35 in FIG. 7, which displays the evolution of the waveform parameters of the unclassified HEMP E1 environment Standards. There are several HEMP environment standards, and some are classified such as DoD-STD-2169. Others are public knowledge such as IEC STD 61000 2-9, MIL-STD-188-125-1, MIL-STD-461G, and MIL-STD-464D. The first HEMP related standard was created by Bell Labs in the 1960s. Since then, revisions have been made as can be seen from Table 35 in FIG. 7 according to an example of the instant disclosure. In general, the parameter values do not present geolocation variations with respect to altitude, distance, atmosphere conditions, field vectors direction, and local Earth surface properties, which impact the formation, propagation, and reflection of the EM field.

Following the standards specifications, the surge protection devices (SPD) are implemented as type 1, 2, and 3 with respect to the point of installation. The Institute of Electrical and Electronics Engineers (IEEE), specifies three location categories (A, B, or C) according to their position from the building service entrance. IEEE also has produced a set of standards known as the "trilogy" to address the surge environment, characterize surges, and define surge testing in low-voltage AC power circuits. It is important to note that localized, small capacity surge protection devices exist and are commercially available for different AC and DC power distribution lines and systems. SPDs for a split-phase 120 VAC and for three phase 277/480 VAC system are manufactured by different vendors. These SPDs have different technical specifications with focus on current and energy handling capacity. Most of the commercially available transient surge protection systems are designed and implemented to be connected across each pair of conductive wires of AC and DC power lines. Power systems below 1000V are considered low voltage.

Looking to FIG. 8, table 40 provides some details of the electromagnetic pulse waveform characteristics associated with lightning strikes according to an example of the instant disclosure. Lightning stroke, as a common physical phenomenon in nature, is one of the main causes of the electric power apparatus failure as well as the power interruption. To assess the susceptibility, level of effects, and damages of electric power equipment, standard lightning impulse, with the wave front/tail time of 1.2/50 us is recommended by the IEC Standard and used in the impulse voltage withstand tests. However, the standard lightning impulse waveform is a statistic result obtained on the transmission lines or towers for triggering lightning, which only can be regarded as a certain kind of lightning impulse waveform. As a side note, lightning is a burst of consecutive strikes and more than 90% of the lightning strikes in nature have a negative polarity.

The lines of the electrical grid can be considered as antenna pathways connected to the upstream and downstream components of the grid and are susceptible to broadband frequencies, including the lower frequency (long wavelength) coupling due to the long length of the power transmission lines. Additional factors influence the level of coupling and interference: wave polarization, geolocation, ground surface conductivity, height of the wires above ground, and others. With their long length, the electrical transmission lines are also susceptible to the E3 HEMP, as further described below.

The internal electrical wirings of a building are susceptible to EMF and would couple directly to the radiated field if the building is without proper shielding. The exposed long wires or internal unshielded wires are susceptible to the radiated field. Without proper mitigation, the induced currents generate magnetic fields that couple the neighboring conductive lines and surfaces. Protection from radiated coupling of EM field is achieved by shielding equipment with a conductive enclosure. In some special cases, the whole building is a shielded structure commonly known as a Faraday cage. Because input and output cables for power and communications must be present, special methods are employed to lower and limit the propagation of the induced transients via these wired connections and their conduit openings. This is not a simple task since the impinging EMP field has a broad frequency spectrum and a high field strength.

Terrestrial vehicles, aircraft, and marine vessels may be considered special cases when evaluating their susceptibility to EMI. Terrestrial vehicles are poor incomplete conductive cages with different sizes, multiple apertures, and without direct contact with the Earth's surface. The aircraft may be modeled as a Faraday cage with limited distributed apertures. Marine vessels represent a good approximation of a Faraday cage for all equipment below deck (metal vessels) and an open exposure to all equipment above deck. The relative standards that evaluate the EM susceptibility address these differences.

A proper grounding of the electrical infrastructure is of great importance for providing passive shielding with a Faraday cage and active transient surge suppression using voltage limiting, energy absorption, and redirection. Grounding systems are well understood and used for terrestrial and naval installations. However, connection to Earth's ground is not applicable for flying aircraft and mobile terrestrial vehicles. With respect to some special cases, a conducting strap or metal chain is used on vehicles to provide a conductive path to ground. The metal marine vessels in saltwater have good contact with conductive media. There are means to provide a contact for vessel with non-conductive body.

One possible way to mitigate the effects of EMP is to provide a response in real time to an event and disconnect the protected systems by isolating them physically from long cables, wires, antennas, etc. Specifically, to protect from the damaging effects of EMP, the environment must be persistently monitored with applicable sensors and when a HEMP is detected, the appropriate isolation systems must be triggered to provide protection for the infrastructure. Given the high speed of the HEMP E1 event, this is not an easy task, has major constraints, and the very limit of abruptly disconnecting current flow especially in high-power installations.

A straightforward protection method is EMI shielding and to equip the electrical and electronic systems with means that prevent the excessive magnitude of voltage and current from reaching the electrical load and absorb and redirect the energy of the EMP. Generally, these devices are known as surge suppressors and arrestors. Most commercially available surge suppressing devices are designed and built to offer protection to lightning with micro-seconds response times. This is not sufficient for protection from the E1 HEMP with a few nanoseconds rise time and from IEMI with variable characteristics (rise time/frequency content and repetition rate).

Figure 9:
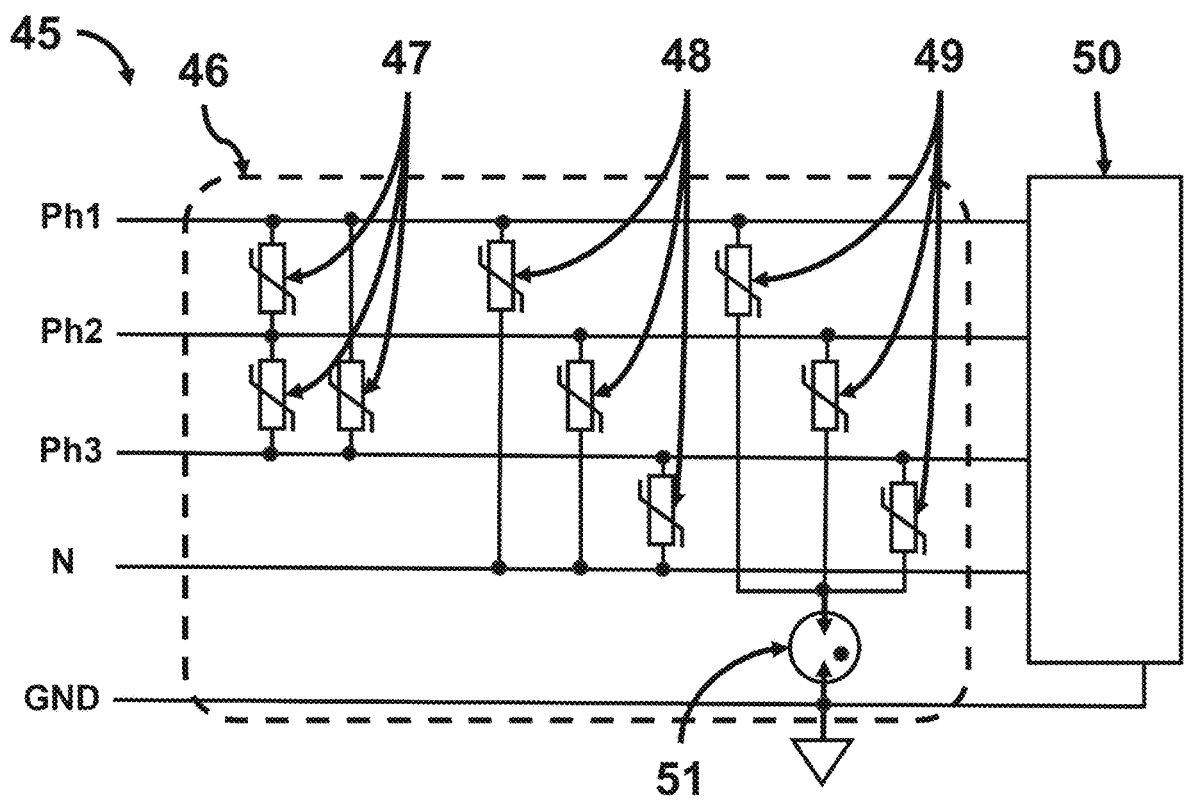
FIG. 9 presents a block-diagram 45 of a generalized view of surge protection device 46 with an installation on a three phase AC power lines according to an example of the instant disclosure.

Looking to FIG. 9, pictograph 45 presents a notional diagram of a surge protection installed on the conductive wires of a three-phase AC power line. There are multiple components available to design and implement a transient suppressing system (TSS) to address the specific needs and requirements. A list of components may include transient voltage suppressors (TVSs), metal oxide varistors (MOVs), gas discharge tubes (GDTs), glass GDTs, avalanche transistors (ATs), spark gap protectors (SPG) and thyristor surge suppressors (TSS), other solid state and nonlinear components based on semiconductors (i.e., Si, Ge), compound semiconductors (i.e., SiC, GaN, GaAs) and metamaterials, mechanical, electrical and ionization discharge devices (IDDs), and combinations thereof, is beyond the scope of this application.

The TVSs have a characteristic fast response time but relatively limited energy absorption capacity. The MOVs and GDTs provide high-capacity energy shunting capability. They have specific advantages and disadvantages. With the continued advancement of material sciences, optimized technologies produce components with better parameters and new components that provide more advanced solutions for transient surge suppression (TSS) and surge protection implementations. In this regard, the wide bandgap semiconductors, and the development of compound semiconductors with groups III-IV elements are very promising to provide new components with fast response and energy handling capacity.

Describing the characteristics of natural and technology-based EM induced over voltages is presented to amplify the importance of SPD and the energy that surge protective components must absorb, shunt, or redirect. Modern surge protection components are designed to withstand high magnitude voltage and current respectively. Due to the immense stress, there is associated degradation of the characteristics and energy handling capacity that degrades with time. Preventing excessive current draw has led to surge protection installation in series with a fuse or circuit breaker. To prevent hazardous effects such as overheating and fire, manufacturers have developed metal oxide varistors (MOV) with built-in thermal fuse connected in series to form a thermal-MOV (TMOV). The status of a TMOV is usually monitored with an LED powered by the AC current passing through the thermal fuse, a diode, and a current limiting resistor connected in series. In an event of excessive energy current, the thermal fuse opens the circuit preventing thermal and fire hazard. This results in eliminating current flow through the LED and indicates a blown-up status of the TMOV fuse. In addition to an LED light indicator, some manufacturers implement a contact closure or disconnect to be used for remote signaling.

The methods and systems discussed herein provide status monitoring and displaying of surge protection systems of electrical and electronic devices connected to an electrical infrastructure network without interfering with the performance of the protection system and the protected system. The status monitoring and displaying system (SMDS) provides an enhanced functionality of the surge protection systems installed on AC and DC electrical networks. The SMDS indicates the normal operational status of monitored TMOVs and the occurrence of an event that results in a melted thermal fuse: a condition that requires replacement of the TSS. The SMDS also monitors the temperature of the surge protection system and indicates internal overheating. Proper grounding is essential for an effective surge mitigation. The described methods and systems include monitoring of the electrical power grounding conditions and issues visual and audible alarms when the system ground is compromised. In addition, the loss of power is indicated with an intermittent sound and visual alarm.

The methods and systems provide enhanced utility of the protection from the effects of excessive EM energy. The analog implementation approach is based on an appropriate combination of components and circuits to complement the surge protection assemblies and monitor their status. The minimalistic design approach combined with proper rating of the analog components provides a robust design and size, weight, and power (SWaP) cognitive implementations with scalability and applications in AC and DC power networks.

With respect to smart grid AC and DC systems and other electrical utility devices with power distribution lines (mini-grid equipment, electrical generators, etc.), the described methods and systems provide surge protection with persistent status monitoring and display. Each TSS installation has an embedded self-monitoring status and display with audible and visual alarm. This is combined with monitoring internal thermal condition and monitoring the neutral lead wire connection to earth ground. The supercapacitor backup power supply of the SMDS guarantees a long intermittent alarm status indication during a power loss condition.

Because of the similarities to lightning-caused electromagnetic pulses and the widespread availability of lightning protection technology, the protection against effects from E2 HEMP is considered to have good solutions. However, because an EMP produced by a nuclear weapon comprises a complex multi-pulse (i.e., the E1, E2, and E3 components), the primary potential problem with the E2 component is the fact that it immediately follows an E1 component which may damage any devices that were intended to be protected. As noted in the United States EMP Commission's Executive Report of 2004, referring to the E2 component pulse, "[I] n general, it would not be an issue for critical infrastructure systems since they have existing protective measures for defense against occasional lightning strikes. The most significant risk is synergistic, because the E2 component follows a small fraction of a second after the first component's insult, which could impair or destroy many protective and control features. The energy associated with the second component thus may be allowed to pass into and damage systems."

The E3 component of the complex multi-pulse is a pulse with a very long rise and fall times, long period of oscillations, and lasts tens to hundreds of seconds. It is caused by the nuclear detonation heaving the Earth's magnetic field out of the way, followed by the restoration of the magnetic field to its natural state. The E3 component has similarities to a geomagnetic storm caused by a very severe solar corona mass ejection (CME), or stellar-induced EMP's from stellar gamma ray burst sources, supernova, hypernova and collisions of neutron stars. Like a geomagnetic storm, an E3 pulse can produce geomagnetically induced currents in long electrical conductors, which can then damage or destroy components such as high voltage power line transformers. The E3 induced currents are often called quasi-DC currents because by their time domain properties they resemble extremely low frequency waveforms (ultra-long wavelengths) inducing DC-like currents into the long power transmission lines. Nearly all major damage from HEMP E3 in modern infrastructure will occur to systems and substations of the electrical power grid, which is generally not designed to handle direct currents. The vulnerability is especially high for critical devices such as high voltage power transformers.

The modern technology advancements have enabled the development of systems for intentional electromagnetic interference which are deployed and used for offensive countermeasures (such as jamming, for example) or for different applications for electronic warfare. More detailed description of man-made and natural electromagnetic surges that cause different levels of effects is beyond the scope of this application. The sources based on natural phenomena or technology-based sources for intentional EMI (IEMI) can impose devastating effects on electrical and electronic infrastructure. To prevent or minimize the damage due to electromagnetic disturbance, proper design and installation of EMI protection and grounding system is essential to suppress the hazardous effect of a surge, absorb the energy, and/or redirect the energy to ground. Continuous monitoring of the status of the deployed surge protection systems is an essential component of the resilience of the implemented electromagnetic protection and mitigation. The methods and systems described in this application provide enhanced monitoring and status display utilizing analog components and circuits and respectively inherent cybersecure implementations.

Looking to FIG. 9, the block diagram 45 of surge protection device (SPD) 46 is presented with an installation on a three phase AC power line to mitigate the electromagnetic energy of over-voltage surges and protect the three-phase electrical load 50, according to an example of the instant disclosure. As shown in FIG. 9, three transient surge suppressors (TSSs) 47 are installed between each pair of electric lines Ph1-Ph2, Ph1-Ph3, and Ph2-Ph3. An additional three TSSs 48 are connected between each phase and the neutral line. Three TSSs 49 are connected in series with a gas discharge tube (GDT) 51 between each phase line and the earth ground line. The addition of a GDT 51 prevents the continuous shorting effect due to the operational characteristic of GDT to maintain its triggered "shunt" condition even after the transient event, The addition of a MOV in series with the GDT will return the GDT to its high impedance (non-conducting) state.

Figure 10:
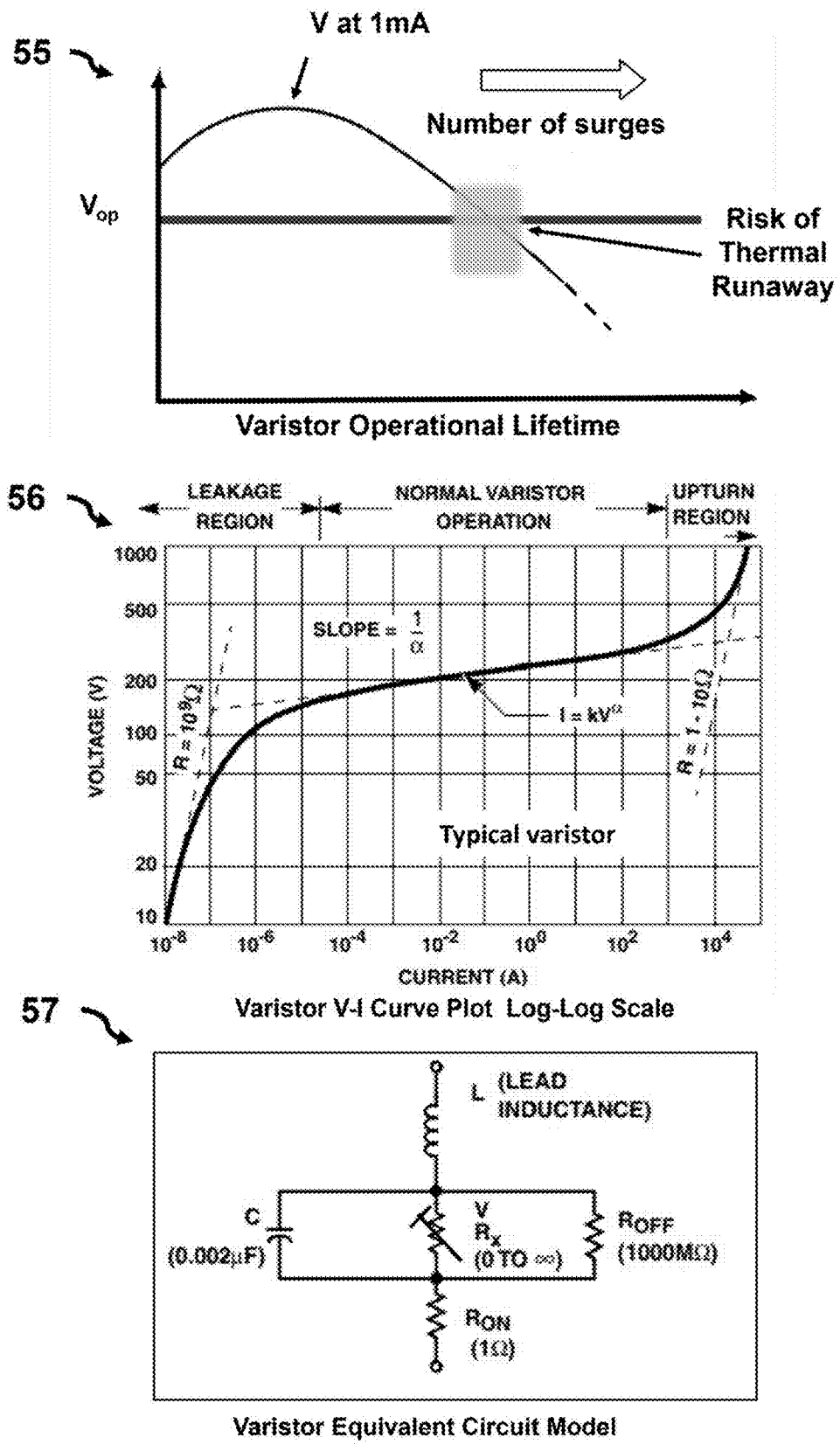
FIG. 10 illustrates a degradation of a Metal Oxide Varistor with plot 55 displaying generalized characteristics during its operational lifetime and the risk of thermal runaway with respect to the number of overvoltage transient surges to which the varistors has been exposed according to an example of the instant disclosure.

Looking to FIG. 10, plot 55 illustrates a generalized characteristics degradation of a Metal Oxide Varistor during its operational lifetime and the risk of thermal runaway as a result of the degradation. As the number of overvoltage transient surges to which the varistors have been exposed increases, a thermal runaway occurs, according to an example of the instant disclosure. Due to the immense stress, there is associated degradation of the characteristics and energy handling capacity of all surge protection components. Preventing excessive current draw has led to surge protection installation in series with a fuse or circuit breaker.

Plot 56 in FIG. 10 displays a typical varistor V-I curve. At low current levels, the V-I curve approaches a linear (ohmic) relationship and shows a significant temperature dependence. At low current levels, the varistor is in a high resistance mode (approaching $10^9 \Omega$) and appears as an open circuit. In this leakage region, the nonlinear resistance component Rx can be ignored, because it is in parallel with $R_{OFF}$ and $R_{ON}$ is insignificant compared to $R_{OFF}$. Plot 57 presents a simplified equivalent electrical circuit model for the varistor. For a given varistor device, capacitance remains approximately constant over a wide range of voltage and frequency in the leakage region. The value of capacitance drops only slightly as voltage is applied to the varistor. As the voltage approaches the nominal varistor voltage, the capacitance abruptly decreases. Capacitance remains nearly constant with frequency change up to 100 kHz. Similarly, the change with temperature is small, the 25° C. value of capacitance being well within ±10% from −40° C. to 125° C. Although $R_{OFF}$ is a high resistance it varies with frequency. The relationship is approximately linear with inverse frequency ($R_{OFF} \sim 1/f$). However, the parallel combination of $R_{OFF}$ and C is predominantly capacitive at any frequency of interest. This is because the capacitive reactance also varies approximately linearly with $1/f$. More in depth description of equivalent models of nonlinear transient suppression components is beyond the scope of this application. The plots in FIG. 10 are given to illustrate characteristic dependencies used for an embedded self-testing and diagnostic, as further discussed below, according to an example of the instant disclosure.

Figure 11:
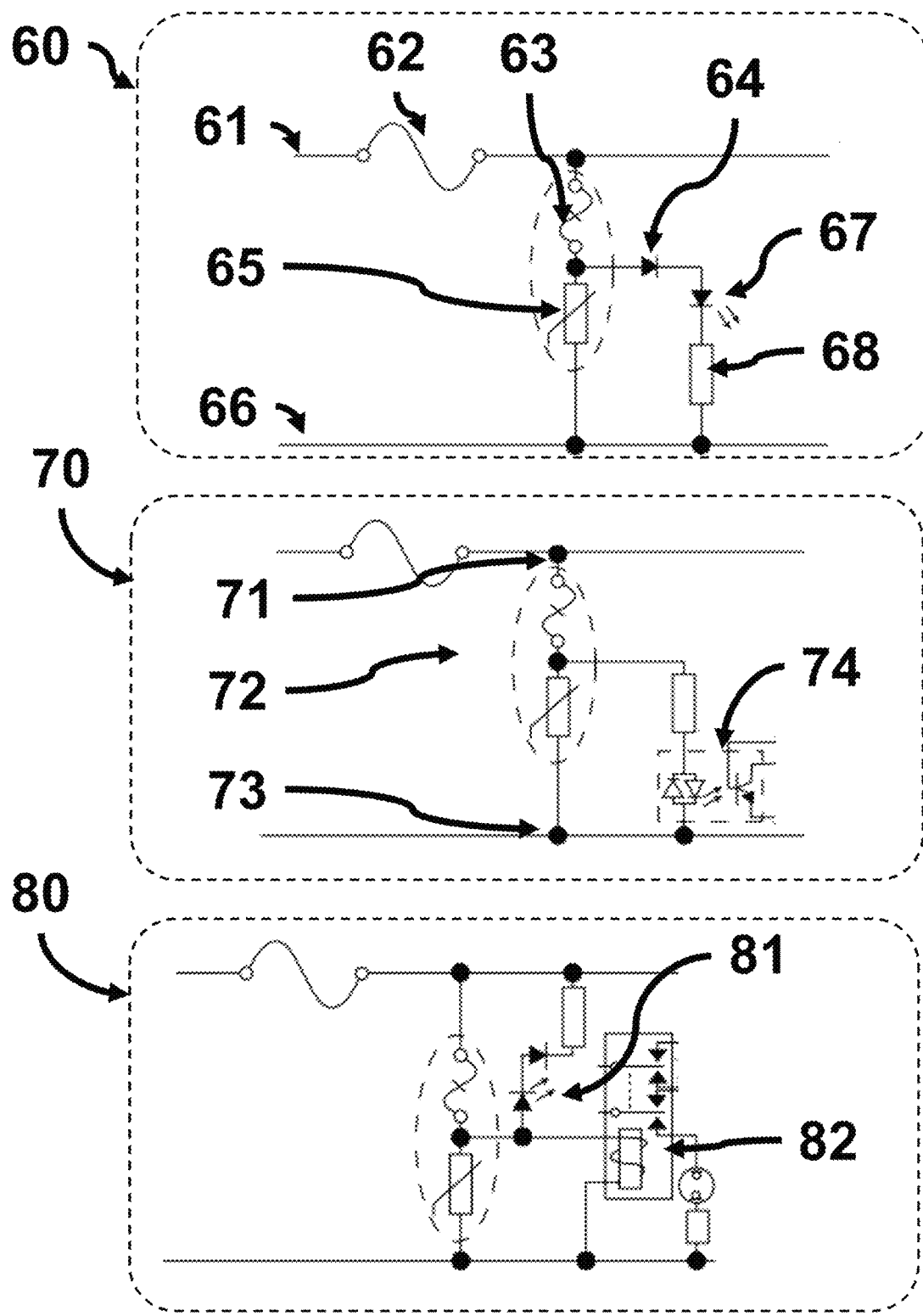
FIG. 11 displays three circuits 60, 70, and 80, commonly used for indicating the normal operation of Thermal Metal Oxide Varistor (TMOV) and respectively a melting of its thermal element according to an example of the instant disclosure.

Looking to FIG. 11, circuits 60, 70, and 80 present commonly used methods for status monitoring of a TMOV, according to an example of instant disclosure. As requested by the standards, the SPDs are connected after a fuse, or a circuit breaker shown with 62 in circuit 60. During normal operational status of the MOV 65, an LED 67 is powered by the AC current passing through the thermal fuse 63 of the MOV, a diode 64, and a current limiting resistor 68 connected in series. In an event of excessive energy dissipation in the TMOV, the thermal fuse 63 opens the circuit and prevents thermal run away and fire hazard. This results in eliminating current flow through the LED 67 and the absence of illumination indicated a blown-up status of the TMOV fuse. Circuit 70 illustrates the use of an optocoupler 74 to monitor the status of the TMOV 72 connected between electrical lines 71 and 73. Circuit 80 utilizes a relay 82 to indicate with a contact closure or disconnect status change the status of the TMOV's thermal fuse to be used for a remote signaling. The LED 81 will turn on and illuminate when the thermal fuse is blown off, according to an example of the instant disclosure.

Figure 12:
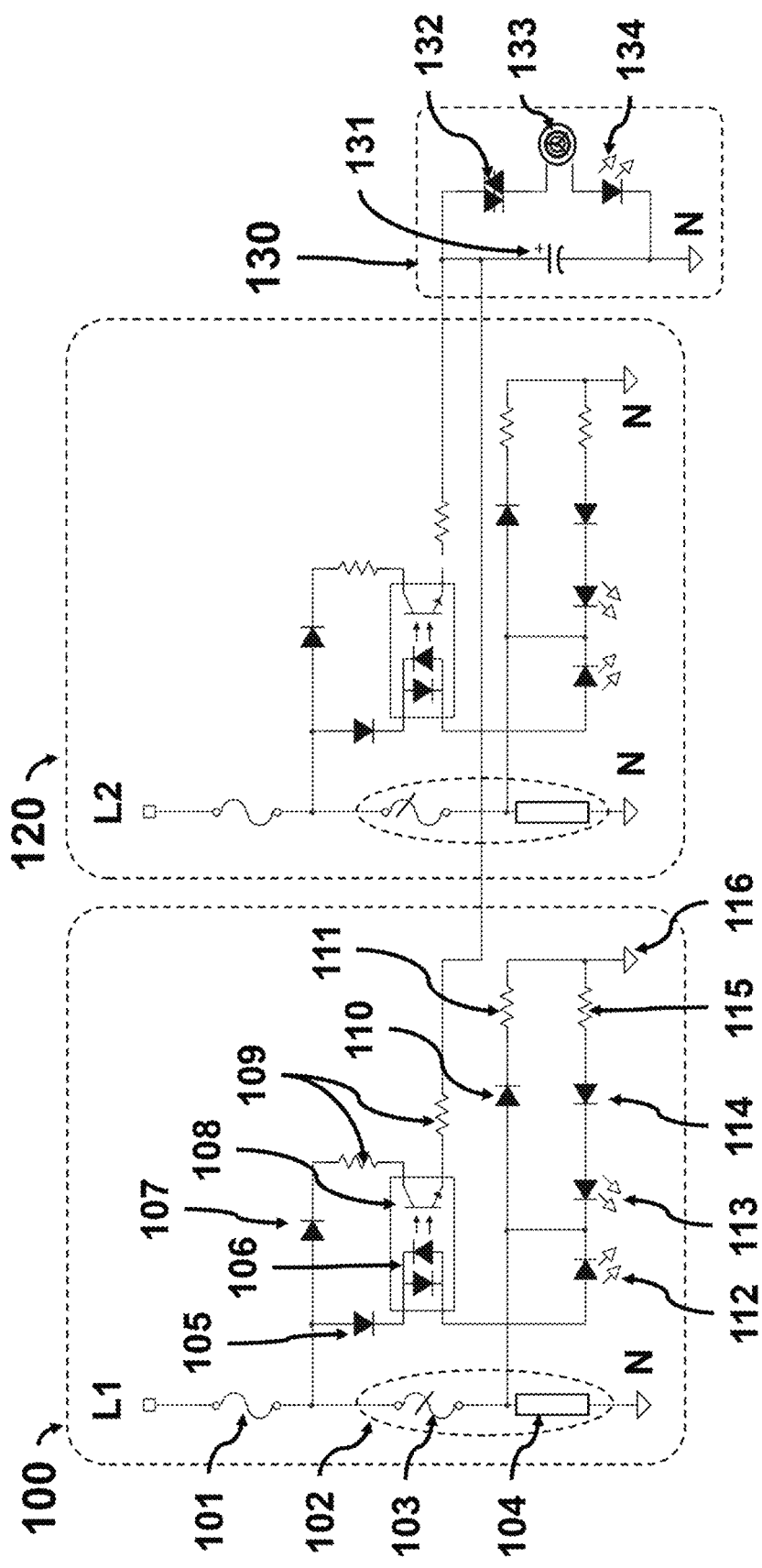
FIG. 12 displays two identical circuits 100 and 120 for monitoring and displaying the status of TMOVs and a circuit 130 for an overall visual and audible display and alarm notification implemented for transient surge protection of a split phase AC power line according to an example of the instant disclosure.

Looking to FIG. 12, a circuit is displayed that consists of three subcircuits 100, 120, and 130 and presents an example of a strictly analog design implementation of status monitoring and display system (SMDS) for use with transient suppression device on a split-phase AC line, according to an example of the instant disclosure. The SMDS includes two identical status monitoring subcircuits 100 and 120 for the two AC lines and a status indication circuit 130. The normal operational status is indicated with a green light LED for each phase line and indicated with 113 for line one L1. LEDs 112 and 113 are a pair of red and green LED with a common cathode. Other colors are possible. The green light changes to red color to indicate a thermal fuse 103 of TMOV 102 has melted (blown off due to excessive current flow). The details of the circuit design is presented in details below. TMOV 102 consists of a metal oxide varistor (MOV) 104 and its internal thermal fuse 103 and is connected after the line one fuse 101.

During normal operation, thermal fuse 103 of TMOV 102 is shunting high voltage diode 105, the LED 106 of optocoupler 108, and the red LED 112. During a fault condition, as a result of thermal fuse 103 melting, current flow through the green LED 113, diode 114, and current limiting resistor 115 is discontinued. During the positive AC cycle, current flows through diode 105, LED 106, red LED 112, diode 110, and resistor 111. The selection of LED color may be different. When current starts to flow through diode 106, the output transistor of the optocoupler 106 starts to conduct current and to charge capacitor 131 of status indication circuit 130 via diode 107 and resistors 109. Capacitor 131 is connected in parallel with diac 132. When the voltage of capacitor 131 exceeds the triggering threshold of diac 132, diac 132 turns on and energizes audible indicator 133 and visual alarm LED 134. Circuit 120 of AC line two (L2) is identical and operates in parallel with circuit 100 to indicate normal or abnormal condition, according to an example of the instant disclosure.

Figure 13:
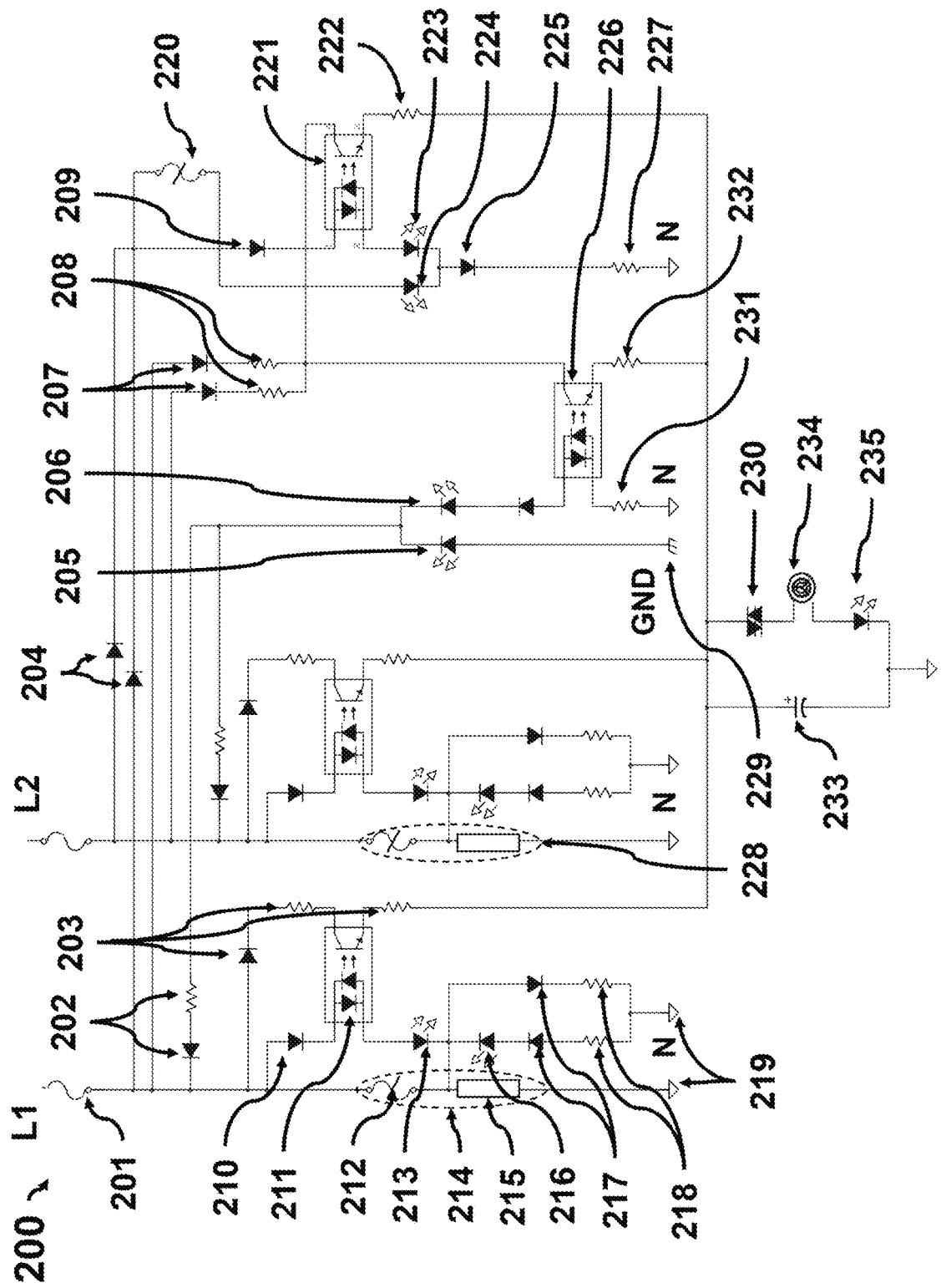
FIG. 13 presents circuit 200 for monitoring and displaying the status of TMOVs used in a surge protection device (SPD) installed on a split phase AC power line, the overall internal thermal condition of the SPD, and the status condition of the ground connection of the SPD, according to an example of the instant disclosure.

Looking to FIG. 13, a schematic diagram 200 presents an enhanced version of analog status monitoring and display system (SMDS), according to an example of instant disclosure. The status of the internal thermal fuses of TMOVs connected on the AC power lines is monitored and displayed. As shown, each phase of the AC power has a common cathode pair of LEDs used to indicate normal (green color) or abnormal (red color) status condition. The subcircuits for AC line one (L1) and AC line two (L2) are identical and for brevity and clarity, explicit annotation is given for the subcircuit for AC line one. The neutral AC line is labeled with N and is annotated with 219 for AC line one. The ground connection is labeled with GND and annotated 229. TMOV 214 of AC line one is connected after line fuses 201. TMOV 214 includes MOV 215 connected in series with its internal thermal fuse 212. The internal connection point of TMOV 214 between MOV 215 and thermal fuse 212 is available externally and connected to common cathode LEDs 213 (red color) and 216 (green color).

During normal operation, thermal fuse 212 is shunting simultaneously diode 210, LED of optocoupler 211, and red LED 213. Red LED 213 and green LED 216 are each connected in series with high-voltage diodes 217 and current limiting resistors 218. Other colors are possible. Green LED 216 is powered during every negative AC cycle. Diodes 217 have a high reverse voltage rating and each one protects the LED with which it is wired in series. When the thermal fuse 212 opens (melting due to overheating), it disconnects the circuit branch of green LED 216 and discontinues shunting red LED 213. The green light of LED 216 is replaced instantaneously with the red light of LED 213, indicating thermal overrun of TMOV 214. When red LED 213 is energized, the LED of optocoupler 211 is energized during every positive AC cycle and its output transistor starts to conduct and to charge capacitor 233, according to an example of the instant disclosure.

The circuit associated with AC line two is identical and operates the same way as described for AC line one. For that reason, only TMOV 228 is labeled for AC line two. When one of the optocouplers of line one or line two is turned on, the current charges capacitor 233. The charging current of capacitor 233 for each AC line passes through a diode and current limiting resistors, as annotated with 203 for AC line one. Capacitor 233 is charging until it reaches the triggering threshold of diac 230. When diac 230 turns on, the audible alarm 234 and visual indicator 235 are also turned on and the intermittent alarm indications continues, as long as AC power is present. When TMOVs' thermal fuses of line one and line two are both melted, capacitor 233 is charged faster resulting in shorter intermittent alarm intervals. The SMDS thermal overrun for each AC line is indicated with a continuous red color LED, according to an example of the instant disclosure.

A proper grounding of power systems is essential, and it is very important for an effective transient surge protection system. This is the reason to include a status monitoring of good, low-impedance connection of the SMDS's neutral line to a ground conductor. As shown in FIG. 13, common cathode LEDs 205 (e.g., green color) and 206 (e.g., red color) are used to respectively indicate a good or a missing (or high impedance) ground connection 229 (GND) of the neutral AC line 219 (N). For AC line one, group 202 of high reverse voltage diode and resistor complete the circuit of LED 205 to the ground conductor. Identical pair of a diode and resistor in series is present for AC line two. When a good ground connection is in present, it is shunting LED 206 and the LED of optocoupler 226. Loss of ground, or a poor ground connection, results in energized LED 206 and optocoupler 226. Diodes 207 and resistors 208 are connected in series and complete the circuits of the output transistor of optocoupler 226 for each AC line via resistor 231 and start charging capacitor 233. This may respectively trigger an alarm, according to an example of the instant disclosure.

An operational condition of internal overheating of surge protection device (SPD) is possible. To prevent a system thermal overrun, as shown in circuit 200, thermal switch 220 (or several switches connected in series) is included in the status monitoring and display system (SPMS) of SPD. Thermal switch 220 completes a circuit for green LED 224 to indicate a normal temperature of the SPDS, while also shunting diode 209, red LED 223 and the LED of optocoupler 221. When thermal switch 206 reaches its thermal threshold, the green LED 224 is disconnected and red LED 223 and LED of optocoupler 221 are energized to indicate a thermal overrun condition. The common cathode LEDs 223 and 224 are energized from each AC line via diodes 204, diode 225, and resistor 227. When the LED of optocoupler 221 is energized, its output transistor is charging capacitor 233 utilizing the same groups of diodes 207 and current limiting resistors 208 used for the ground fault monitoring subcircuit, according to an example of the instant disclosure. The circuit components are selected according to the voltage of the protected AC line.

Figure 14:
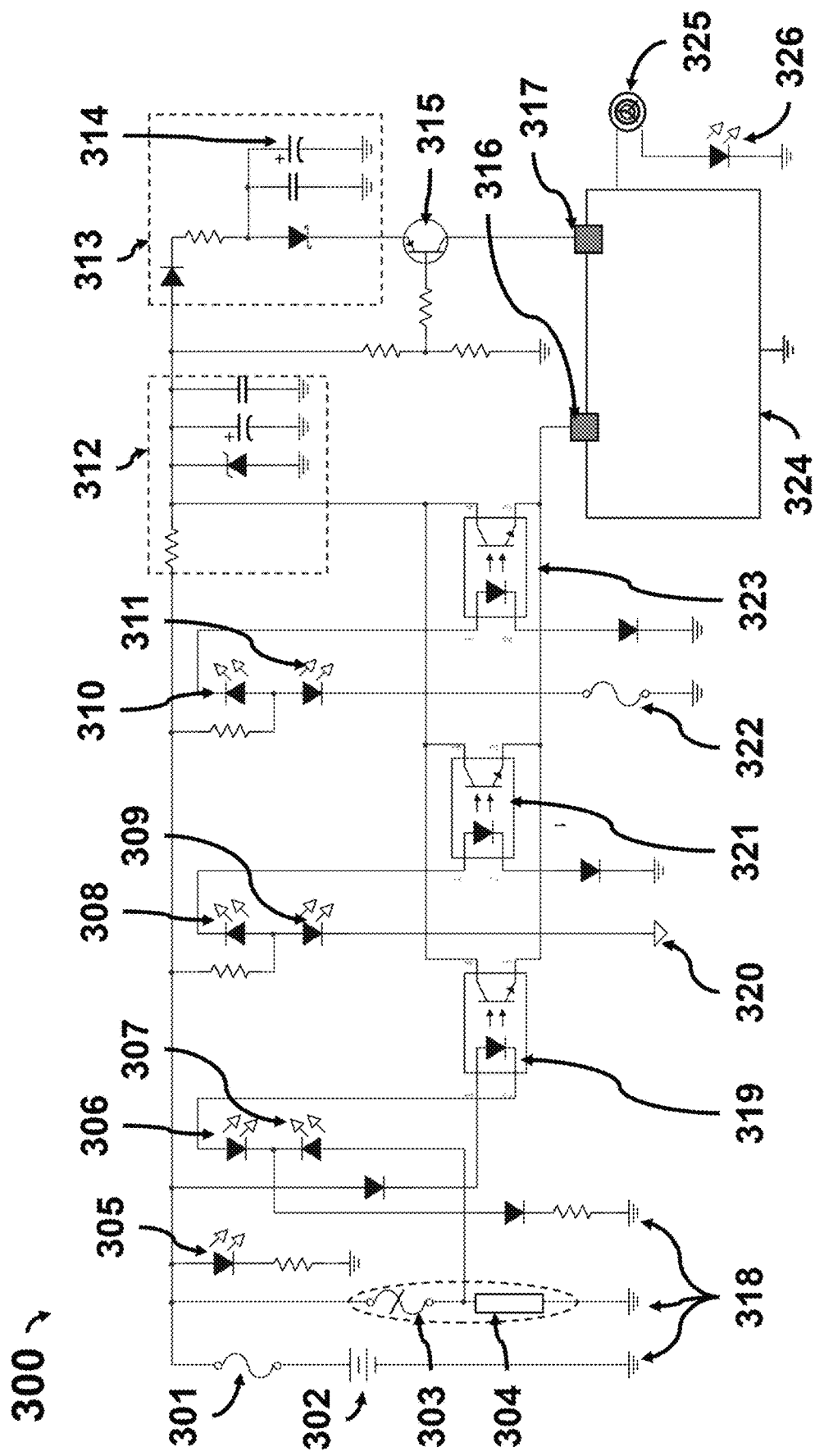
FIG. 14 presents circuit 300 for monitoring and displaying the status of TMOVs used in a surge protection device (SPD) installed on a split phase AC power line, the overall internal thermal condition of the SPD, and the status condition of the ground connection of the SPD with visual and audible notification of faut conditions using a built-in AC to DC converter low voltage power supply and a supercapacitor based backup power supply in case of the input power loss, according to an example of the instant disclosure.

Looking to FIG. 14, schematic diagram 300 presents a strictly analog implementation of a status monitoring and display system (SMDS) for surge protection device installed on a DC power system, according to an example of the instant disclosure. A DC power system is presented with 302 in series with a circuit breaker 301. LED 305 indicates that a DC power is present. As shown in the schematic, the unipolar power may result in some differences in the implementation of bicolor LED components use which will be discussed in detail below. In this example embodiment, a DC down conversion with component group 312 of a resistor, a Zener diode, and two capacitors is used to power a low voltage display subcircuit. Common cathode LEDs 306 and 307 are used to indicate normal or abnormal status condition of TMOV presented with MOV 304 and internal thermal fuse 303. An abnormal condition with a visual and sound alarm is triggered using optocoupler 319 for TMOV thermal overrun, optocoupler 321 for proper grounding, and optocoupler 323 for overall internal overrun. The output transistors of optocouplers 319, 321, and 323 power and enable the alarm subcircuit 324 via its port 316.

In circuit 300, the DC negative pole is annotated with 318 and the earth's ground with 320. Thermal switch 322 is a single element or several distributed elements connected in series. The current limiting resistors for the LEDs and the optocouplers' LEDs are rated for voltage and power according to the voltage of the protected DC power line. In a similar way to the previous circuits, the system internal thermal status is monitored and displayed, and the status of the grounding connection is monitored and displayed. An abnormal condition is indicated with a visual and sound alarm driven by an analog timing circuit 324 based on the 555 integrated circuit in this example embodiment. Furthermore, a supercapacitor 314 is charged during normal operation using subcircuit 313 to provide power supply when input DC power on the protected line is lost. When DC power is absent, an auto switch based on transistor 315 connects the supercapacitor to power analog subcircuit 324 via its power port 317 and provides an intermittent visual and sound alarm indication with LED 326 and buzzer 325.

Looking to FIG. 14, the DC down conversion is implemented with a simple circuit based on a Zener diode. Respectively, different DC-DC converters may be used. The shown example embodiment of circuit implementation is scalable for use with preselected DC power voltages in a broad range (for example, from 12 VDC to 600 VDC and even higher). For low voltage DC power, a DC-DC converter is not necessary when properly rated supercapacitor, rechargeable battery, or a combination of power storage for the display subsystem. With properly rated components, the circuit is scalable for any DC voltages. It is suitable for status monitoring and display system (SMDS) of surge protection device (SPD) installed on solar photovoltaic systems with variable configurations of solar panels and respectively DC voltages, according to an example of the instant disclosure.

Figure 15:
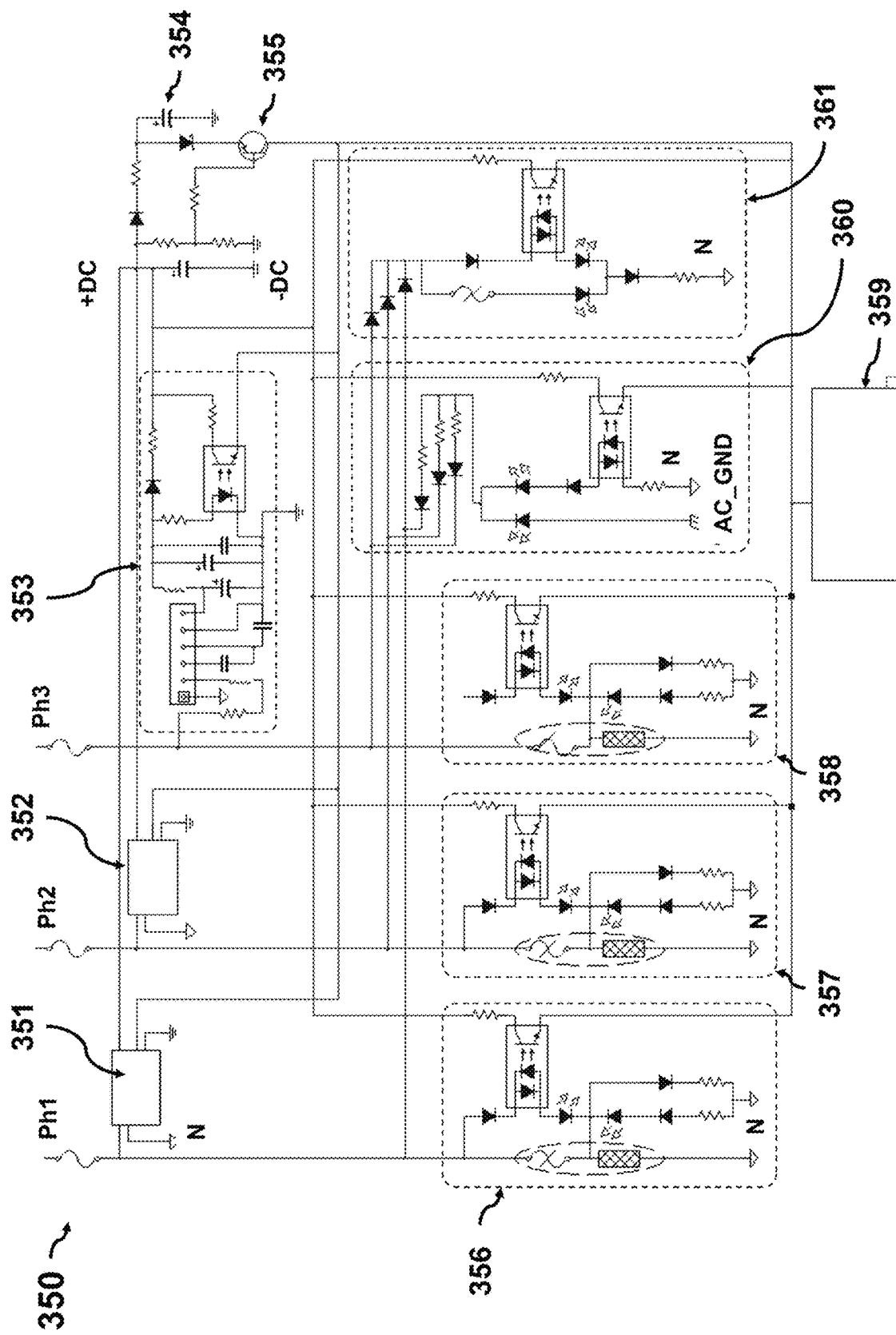
FIG. 15 presents circuit 350 for monitoring and displaying the status of TMOVs used in a surge protection device (SPD) installed on a three phase AC power line, and also monitoring the overall internal thermal condition of the SPD and the status condition of the ground connection of the SPD, using AC to DC converters on each phase power line to provide low voltage power supply and a backup power supply with a supercapacitor for visual and audible notification of fault conditions, including the loss of input AC power, according to an example of the instant disclosure.

Looking to FIG. 15, circuit 350 illustrates the use of analog subcircuit 359 for audio and visual alarm condition indication, based on the integrated circuit IC555 and used with SPDs installed on a three-phase AC power lines, according to an example of the instant disclosure. High voltage output optocouplers are used to isolate the AC voltage and the low voltage DC subcircuits. AC-DC converters 351, 352, and 353 are used for powering the low DC voltage subcircuits. Subcircuit 353 presents general external components associated with an AC-DC converter. The current limiting resistors for the display LEDs, the optocouplers' LEDs, and optocouplers outputs are respectively selected for voltage and power according to the voltage of the protected AC line (for example, 120 VAC, 277 VAC, 480 VAC, etc.). Subcircuits 356, 357, and 358 are for monitoring and display of normal and abnormal status condition of TMOVs of AC line phase one (Ph1), phase two (Ph2), and phase three (Ph3). The three-phase subcircuits are identical to the split-phase AC circuit. They were presented, displayed, and described previously with circuit 100 of FIG. 12, and circuit 200 of FIG. 13. Subcircuit 360 in FIG. 15, monitors and displays the status of the ground connection of a SPD installed on a three-phase AC line, according to an example of the instant disclosure. In a similar fashion, subcircuit 361 monitors and displays the status of the overall thermal condition of an SPD described in connection with AC SPDs presented in FIG. 12 and FIG. 13. Any one of subcircuits 356, 357, 358, 360 and 361, when triggered, provides power to the visual and audio alarm subcircuit 359. The supercapacitor 354 is charged during normal operation and powers the subcircuit 359 in case of a complete AC power loss, according to an example of the instant disclosure.

Figure 16:
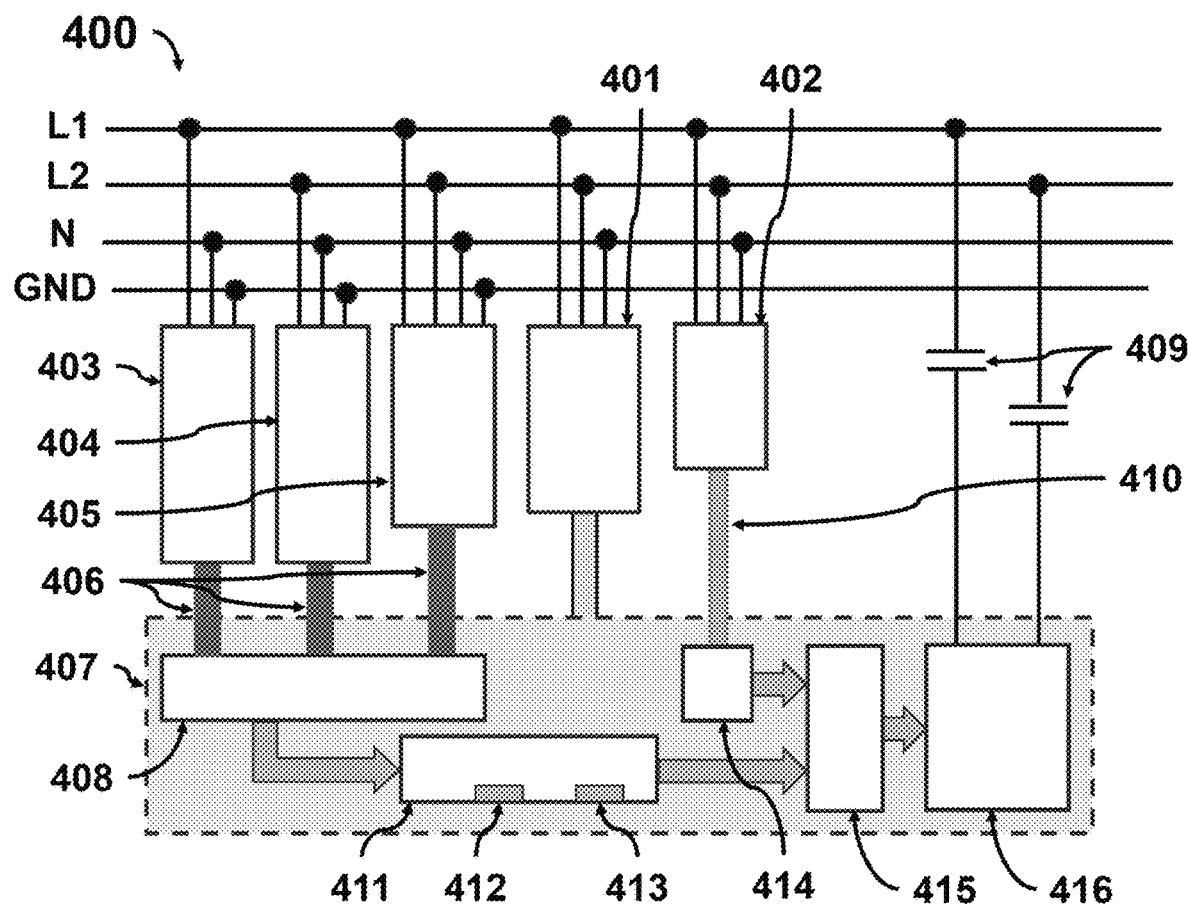
FIG. 16 presents block diagram 400 of a SPD installed on a split-phase AC power line with status monitoring of its TMOVs, its internal thermal condition, and ground connection status, with implemented subsystem to transmit the status condition over the AC power lines using low voltage high frequency burst of pulses injected on the power line at zero crossing when an abnormal condition is detected, according to an example of the instant disclosure.

Looking to FIG. 16, a schematic block diagram 400 presents an example embodiment of a strictly analog circuit implementation of a status monitoring and display system (SMDS) for an AC power line transient surge suppression. Normal or abnormal status condition of the surge protection device TMOVs, the internal thermal status, and the status of the grounding connection are monitored and displayed with subcircuits like the ones shown previously in the example embodiment in FIGS. 12, 13, 14, and 15. The block diagram 400 presents TSSs 403 and 404 for the two split-phase lines L1 and L2, thermal status monitoring and grounding status monitor subcircuit 405. Subcircuit 401 includes two AC-DC converters providing DC power to an overall local alarm circuit 408 and several other strictly analog subcircuits forming 407 over-the-power-lines communication module (OPLC). Analog circuit 402 provides zero crossing detection of the 60 Hz AC power line waveform and outputs a pulse every 16.6 ms (60 Hz) via 410 line to trigger analog circuit 414 of OPLC module 407.

Looking to FIG. 16, outputs of subcircuits 403, 404, and 405 trigger local alarm circuit 408 which also enables a high-frequency pulse generator 411. High-frequency pulse generator 411 may be triggered also via an additional triggering input 412 and the trigger is routed to output 413 of the high-frequency pulse generator 411. The auxiliary trigger input 412 and output 413 provide the capability for alarm circuits to be triggered from other SPD also to trigger other SPD. This functionality allows a coordinated use of multiple SPDs. The output of high-frequency signal from 412 is connected to one input of a long-period timer circuit 415. The long-period timer 415 generates a monopolar pulse with microseconds duration selected to allow several pulses from high-frequency generator 411 to be passed to the input of interface circuit 416 synchronized with a triggering pulse provided by 414 at every instant circuit 402 detects a zero crossing of the AC power line waveform. The long-period timer 415 generates a pulse with duration selected to enable several high-frequency pulses (a burst of pulses) to be sent to circuit 416, which provides a filter interface to decouple the AC power line and with capacitors 409 enable the high frequency burst of pulses to be sent to the AC power line. Transmission of a burst of low voltage pulses is at zero crossing instances and intermittently for a relatively long period (e.g., several seconds). The details of this example implementation will be discussed further below, according to an example of the instant disclosure.

Figure 17:
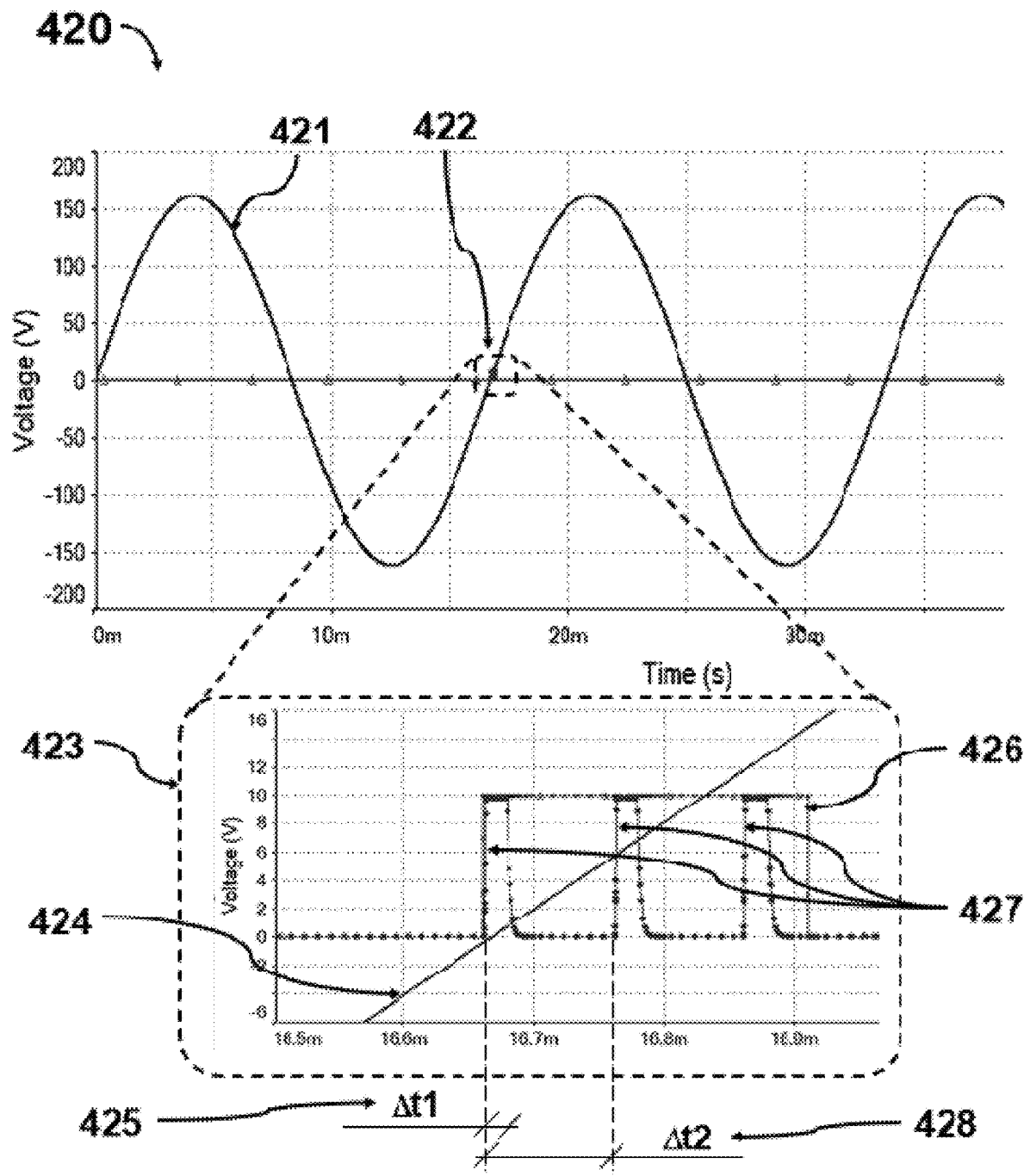
FIG. 17 presents plot 420 with the superimposed waveforms of a 60 Hz AC power line and the low voltage high frequency burst of pulses injected on the power line at zero crossing when an abnormal condition is detected, according to an example of the instant disclosure.

Looking to FIG. 17, plot 420 illustrates the generation of a burst of high frequency pulses at voltage zero-crossing instant 422 on a 60 Hz AC power line waveform 421. Zoom in view 423 displays segment 424 of the 60 Hz power line waveform. At a zero-crossing instant, window period 426 enables the passing of a selected number of high frequency pulses 427 and their superposition (injection) on the power line, as previously described. Time domain plot 423 is used to illustrate the burst generation at zero crossing. The frequency of the pulses is inversely proportional to period $\Delta t2$. The pulse duration $\Delta t1$ is not critical and has to be with a sufficient duration for detection. The intermittent repeatable transmission at zero crossing of well-defined burst of pulses provides robustness of the method for alarm notification. For clarity, only three pulses and a frequency of 10 kHz is used for plot 423. The use of a burst with five pulses with 100 KHz frequency will take only 50 us to transmit. At 50 us after voltage zero crossing, the sinusoidal AC power line waveform (60 Hz and peak amplitude 169.7 V) is only ~3.2 V. The use of short burst of high frequency pulses, transmitted on 60 Hz AC power line at waveform zero crossing, allows the use of low-voltage monopolar pulses (positive or negative) and provides sufficient signal to noise ratio for detection of the transmitted pulses with no interference on the AC power line, according to an example of the instant disclosure.

Figure 18:
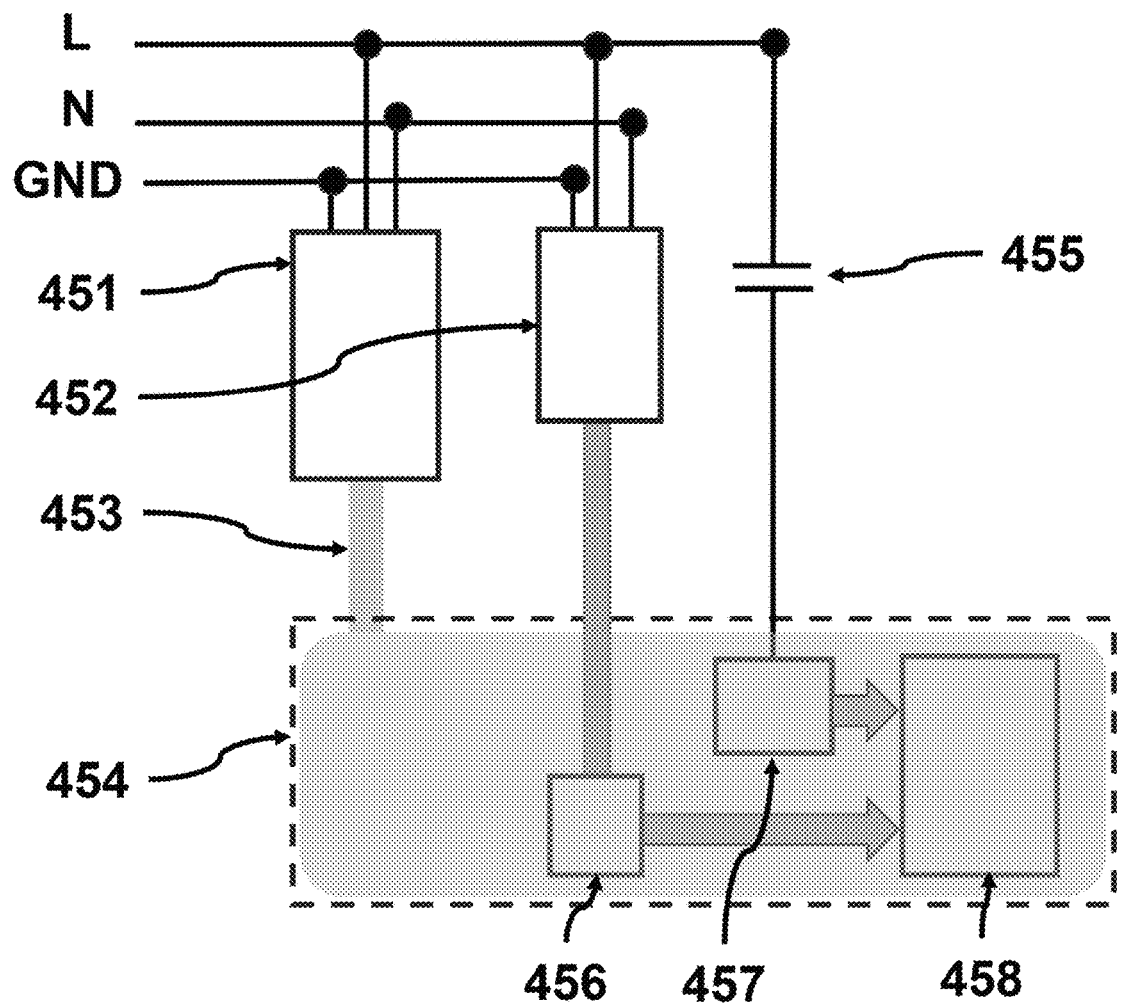
FIG. 18 displays block diagram 450 of a remote status monitoring receiver responding to detection of a burst of high frequency pulses on the power line at 60 Hz AC waveform zero crossing and notifying for a fault condition, if present, according to an example of the instant disclosure.

Looking to FIG. 18, block diagram 450 illustrates the receiver of over-the-power-lines communication module (OPLC) with a single-phase circuit. Subcircuit 451 is an AC-DC converter that provides power to detector 454 via DC power line 453. Circuit 456 generates a pulse every time it receives a pulse from zero crossing detector 452 and sends this pulse with predefined duration to enable input of alarm detector 458. When a high frequency burst of pulses is received by filtering circuit 457 via decoupling capacitor 455, it is sent to the second input of the alarm detector 458. Using this method of OPLC, a fault (alarm) condition is detected, according to an example of instant disclosure.

Figure 19:
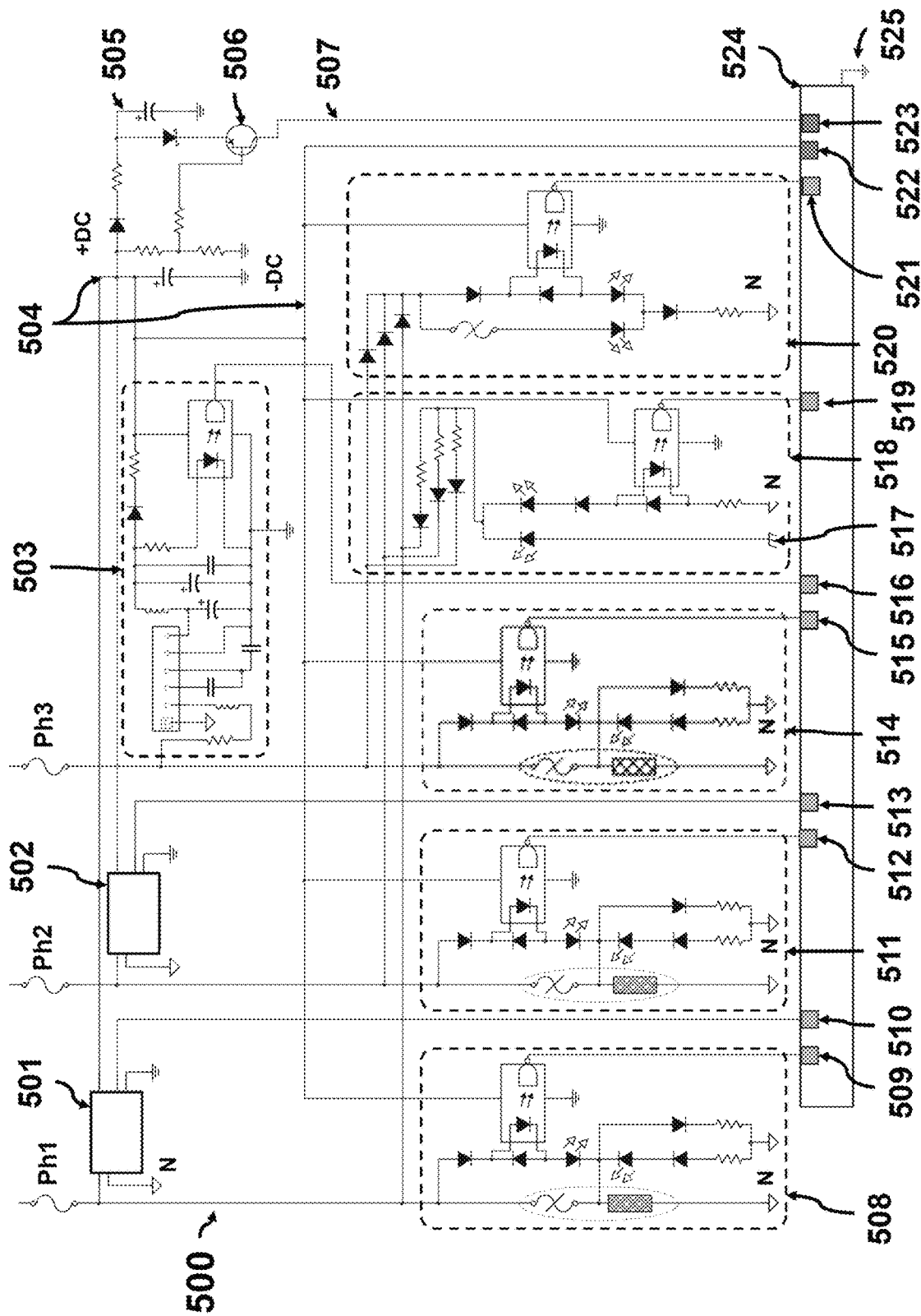
FIG. 19 presents circuit 500 for monitoring and displaying the status of TMOVs used in a surge protection device (SPD) installed on a three phase AC power line, and also monitoring the overall internal thermal condition of the SPD and the status condition of the ground connection of the SPD, using AC to DC converters on each phase power line to provide low voltage power supply and a backup power supply based on a supercapacitor to power an embedded microcontroller for local visual and audible notification of fault conditions and a wireless communication, according to an example of the instant disclosure.

Looking to FIG. 19, circuit 500 displays a status monitoring and display system (SMDS) installed on a three-phase AC system. The circuit has several new implementations in comparison with circuits previously described. The normal/abnormal condition is monitored and indicated for each phase with subcircuit 508 (Ph1), 511 (Ph2), and 514 (Ph3). A fault condition enables instantaneously a red color LED and an optocoupler connected in series with the red LED. Each optocoupler has a logic level output which is connected to an interface input of an embedded digital module (subcircuit) 524. The interface inputs for monitoring the operational status of TMOVs are annotated with 509 (Ph1), 512 (Ph2), and 515 (Ph3).

Low-voltage DC power to subcircuit 524 is provided by power distribution bus 504 that combines the outputs of three AC-DC converters 501 (Ph1), 502 (Ph2), and 503 (Ph3). Power bus 504 is connected to power input 522 of embedded module 524. The negative pole of the DC power is connected to low-voltage ground 525. As illustrated with the expanded circuit of AC-DC converter 503, a logical output is provided to indicate a normal operation of the converter. The interface inputs for monitoring the operational status of AC-DC converters are annotated with 510 (Ph1), 513 (Ph2), and 516 (Ph3). The status of SPD ground connection 517 is monitored with subcircuit 518, which provides a logic level output to input 519 of module 524. The overall internal thermal status of the SPD is monitored with subcircuit 520 and reported to module 524 via its input 521. During normal operation, power bus 504 charges a supercapacitor 505 which provides power to 524 when all the three AC phases lose power. Power port 523 of module 524 is connected automatically by transistor 506 and power line 507. The status monitoring and display system illustrated with circuit 500 provides more flexibility and scalability with respect to the high voltage AC power lines. The embedded digital module may be used on different High voltage circuits without any hardware changes. It may be augmented with software to include data collection, on board computation, machine learning and artificial intelligence (ML/AI), and a wireless communication channel, according to an example of instant disclosure.

Figure 20:
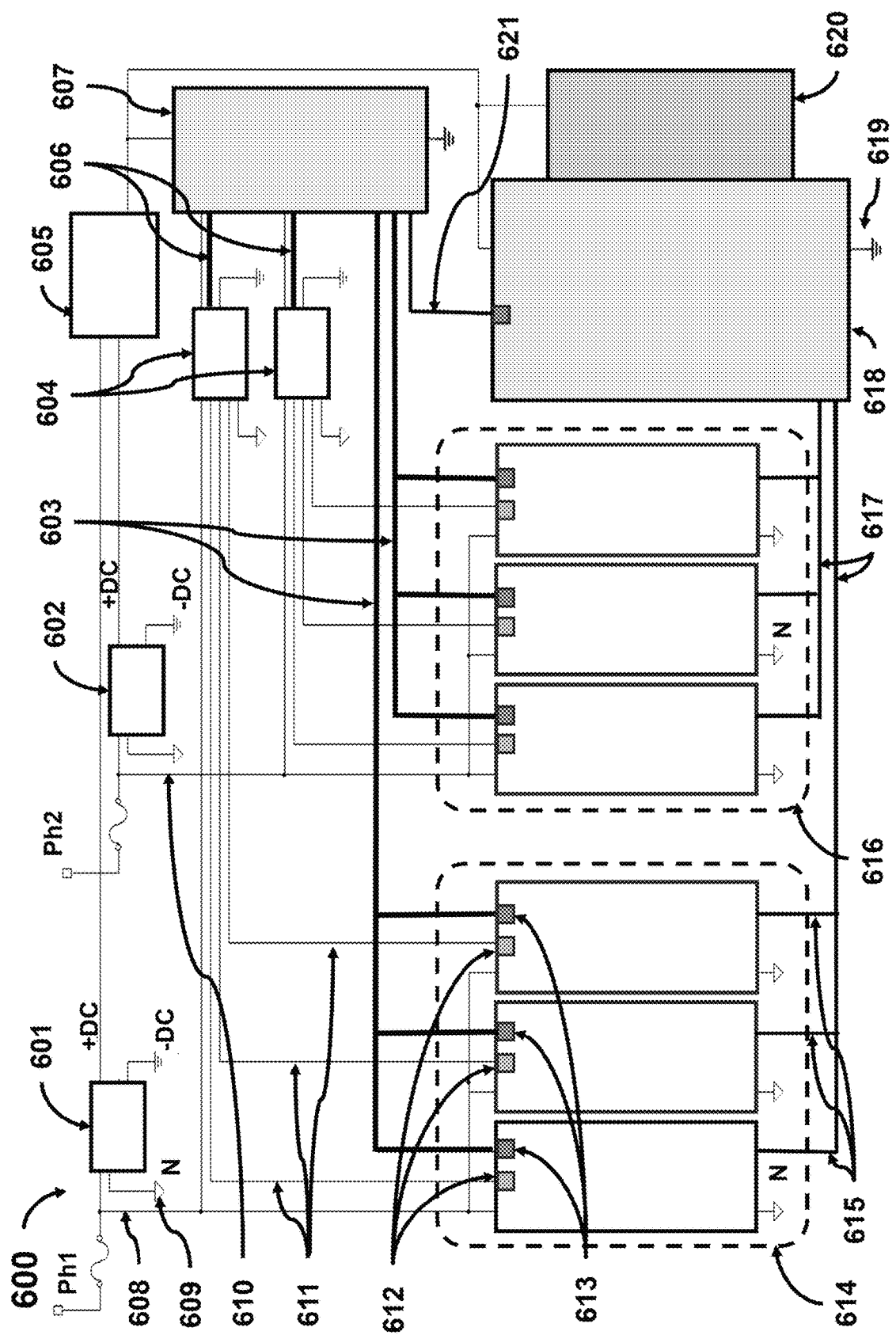
FIG. 20 presents the block diagram 600 of system for internal self-testing for changes of operational characteristics of plurality of components used in SPDs for limiting, absorbing, and shunting of overvoltage and current transients without interfering with the normal operation of the SPD and the protected electrical networks and continuously displaying the status of the components according to an example of the instant disclosure.

Looking to FIG. 20, circuit 600 displays a status monitoring and display system (SMDS) augmented with self-testing and diagnostic capabilities illustrated with an example of its use on a split-phase AC power line. The method may be used on any AC and DV electric power lines. AC-DC converter 601 on phase line one 608 and AC-DC converter 602 on phase line two 610 have their DC outputs combined by submodule 605, which provides DC power to all modules powered by low-voltage DC and also a backup power, as previously described. The neutral AC line is annotated with 609 and the low-power DC negative pole with 619. Module 618 is a local display and communicates status information via communication module 620. The analog status of subcircuits 614 and 616 is provided to display module 618 via status lines 617. Only the individual outputs 615 of test subcircuit 614 are annotated. The subcircuit modules of circuit 600, described in this paragraph, and functionality are identical to previously described status monitoring and display circuits.

Subcircuits 614 and 616 in FIG. 20 comprise multiple component test and monitoring (T&M) circuits. They form the core of the augmented self-testing and diagnostic capabilities. Referring to the plots in FIG. 10 and as previously discussed, the characteristics of all electronic components change with time and the level of degradation depends on the number of transients to which a component is subjected to, the severity (overvoltage and current magnitude) of the transients, the rise-time of transient (dV/dt), repetition rate, temperature, and others. Every new component has specific characteristics, and they are used for quality control and evaluation during manufacturing. IEEE Standard C62.33 defines component characteristic as an inherent and measurable property of a device. Such a property may be electrical, mechanical, or thermal, and can be expressed as a value for stated conditions. The current measurement test in the "leakage region" of component V-I characteristic curve is often used for non-destructive testing of nonlinear devices status. The examples plots and varistor equivalent model, given in FIG. 10, illustrate the use of nondestructive testing for component status monitoring and diagnostics, according to an example of the instant disclosure.

Embedded microcontroller circuit 607 monitors the analog outputs 613 of test subcircuits 614 via analog current monitoring lines of test bus 603. The signals of outputs 613 of test subcircuit 614 is in response to variable signals presented at inputs 612. The description for subcircuit 614 applies to the identical test subcircuits 616. The test signals are generated by modules 604 under control from embedded microcontroller 607 via digital interfaces 606. Modules 604 are step-up DC-DC converters which generate test signals at its multiplexed outputs to the inputs 612 of nonlinear component under test via control lines 611. The functionality of test subcircuit 616 is identical and it is not given in the circuit. The test response signals are presented at analog-to-digital converter of the 607 and component status is evaluated based on component's test model. Status data is transmitted to display module 619 via digital interface 621. Test bus 603 has voltage monitoring lines which are used with high-voltage resistor dividers in circuits 614 and 616 and are used to count and quantify the overvoltage events, according to an example of the instant disclosure.

The invention is not limited to the particular embodiments illustrated in the drawings and described above in detail. Those skilled in the art will recognize that other arrangements could be devised. The invention encompasses every possible combination of the various features of each embodiment disclosed. One or more of the elements described herein with respect to various embodiments can be implemented in a more separated or integrated manner than explicitly described, or even removed or rendered as inoperable in certain cases, as is useful in accordance with a particular application. While the invention has been described with reference to specific illustrative embodiments, modifications and variations of the invention may be constructed without departing from the spirit and scope of the invention as set forth in the following claims.

What is claimed is:

1. A method for persistent status monitoring and displaying (SMD) of transient electromagnetic surge protection devices (SPDs) installed on an alternating current (AC) or direct current (DC) electrical power network (EPN) to prevent an electromagnetic pulse (EMP) generated by a high-altitude nuclear weapon detonation (HEMP), Intentional Electromagnetic Interference (IEMI) generated by directed energy electromagnetic warfare weapons, naturally occurring events comprising lightning strikes, solar coronal mass ejection (CME), and Geomagnetic disturbance (GMD), from reaching electrical and electronic devices connected to the EPN, the method comprising:
    periodically generating test signals and collecting a response of tested surge protection components and evaluating components characteristics status using a mix-signal digital and analog implementation of SMD circuits;
    wherein the test signals are generated by step-up DC-DC converters which generate test signals at its multiplexed outputs to inputs under control from embedded microcontroller via digital interfaces;
    responding instantaneously to a fault condition induced by an electromagnetic transient surge and exceeding a threshold energy level of at least one analog component with voltage dependent nonlinear impedance and displaying a change of an associated thermal fuse operational status using strictly analog network circuits connected to the at least one analog component and thermal fuse for monitoring and displaying the operational status;
    providing embedded persistent status monitoring and displaying using the strictly analog circuits comprising identical status monitoring subcircuits for each power line and a status indication circuit to provide on-board audio and local visual display of normal operational status and fault condition, the on-board audio and local visual display comprising a light indicator for each power line that visually provides a first visual indication for normal operational status and a second visual indication and audible alarm indicating that a thermal fuse has melted;
    providing the embedded persistent status monitoring and displaying simultaneously with a voltage level output to an interface input of an embedded logical module comprising a strictly analog circuits implementation, the interface input comprising a single connection for a DC power line, two L1 and L2 connections for split-phase AC power lines, and three Ph1, Ph2, and Ph3 connections for three-phase AC power, respectively, and each of the subcircuits and the status indication circuit;
    providing the embedded persistent status monitoring and displaying using an analog circuit transmitter for over-the-power-lines communication (OPLC) for remote status displaying in combination with an OPLC analog circuit receiver installed on the electrical power network; and
    providing a voltage zero-crossing detection on an AC power line using the at least one analog circuit for detection, and triggering an analog gate enabling short-burst high-frequency pulse generation at voltage zero-crossing on the AC power line for over-the-power-lines communication (OPLC), wherein at a zero-crossing instant, a time window period enables passing of a predefined number of high frequency pulses and a respective superposition on the AC power line for less than five hundred microseconds via high frequency coupling capacitors.

2. The method for persistent status monitoring and displaying as in claim 1, further comprising providing the embedded persistent status monitoring and displaying of SPD-protected AC and DC electric power lines.

3. The method for persistent status monitoring and displaying as in claim 1, further comprising providing the embedded persistent status monitoring and displaying of AC power neutral line and earth ground connection of SPD-protected electric power line.

4. The method for persistent status monitoring and displaying as in claim 1, further comprising providing the embedded status monitoring and displaying of internal thermal condition of the SPD.

5. The method for persistent status monitoring and displaying as in claim 1, further comprising using the strictly analog high-voltage circuits for SPD status monitoring and displaying scalable for high-voltage AC and DC electric power lines.

6. The method for persistent status monitoring and displaying as in claim 1, further comprising combining, by an on-board low-voltage DC power supply, outputs of AC-DC converters on all phases of an AC power line to provide low-voltage DC power to on-board low-voltage circuits when AC power on a phase is lost.

7. The method for persistent status monitoring and displaying as in claim 6, wherein the on-board low-voltage DC power supply is used to power local and remote status display implemented with low-voltage analog circuits.

8. The method for persistent status monitoring and displaying as in claim 6, further comprising providing on-board backup power supply based on using the on-board low-voltage DC power supply for charging a supercapacitor or rechargeable batteries and using the on-board backup power supply to continue intermittent status alarm display when primary power is not present.

9. The method for persistent status monitoring and displaying as in claim 1, further comprising providing cyber-secure communication for status transmission and displaying at a remote location using analog transmitter and receiver circuits for over-the-power-lines communication (OPLC).

10. The method for persistent status monitoring and displaying as in claim 1, wherein analog transmitter and receiver circuits for OPLC use a short-burst of high-frequency monopolar pulses within less than one hundred microseconds at voltage zero-crossing on the AC power line.

11. The method for persistent status monitoring and displaying as in claim 10, further comprising using the analog transmitter and receiver circuits for OPLC using a short-burst of high-frequency pulses, which comprises a different number of pulses to communicate specific information for a fault condition in the SPD.

12. The method for persistent status monitoring and displaying as in claim 10, wherein the analog transmitter and receiver circuits for OPLC use a short-burst of high-frequency pulses, transmitted at voltage zero-crossing on the AC power line, to allow use of low-voltage monopolar pulses and provide sufficient signal to noise ratio for detection of the transmitted pulses with no interference on the AC power line.

13. The method for persistent status monitoring and displaying as in claim 12, wherein the analog transmitter and receiver circuits for OPLC use the short-burst of high-frequency pulses comprising monopolar pulses of negative polarity, at a rising voltage zero-crossing, and positive polarity at falling voltage zero-crossing, to further improve a signal to noise ratio of an OPLC channel.

14. The method for persistent status monitoring and displaying as in claim 9, wherein the analog transmitter for over-the-power-lines communication (OPLC) for remote status displaying is using an auxiliary input and an auxiliary output to provide triggering from an external SPD transmitter and triggering of a third interlinked SPD transmitter for over-the-power-lines communication.

15. The method for persistent status monitoring and displaying as in claim 14, wherein the auxiliary input and auxiliary output of the analog transmitter for over-the-power-lines communication (OPLC) allow remote status OPLC monitoring of an SPD, installed on a DC power network, to trigger status communication from a different SPD installed on an AC power network.

16. The method for persistent status monitoring and displaying as in claim 14, wherein the auxiliary input and auxiliary output of the analog transmitter for over-the-power-lines communication (OPLC) allow remote status OPLC monitoring of an SPD installed at an input of a DC to AC inverter.

17. The method for persistent status monitoring and displaying as in claim 14, wherein the auxiliary input and auxiliary output of the analog transmitter for over-the-power-lines communication (OPLC) allow remote status OPLC monitoring of an SPD installed at an output of a DC charger.

18. A system for persistent status monitoring and displaying (SMD) of transient electromagnetic surge protection devices (SPDs) installed on an alternating current (AC) or direct current (DC) electrical power network (EPN), comprising:

a mix-signal digital and analog implementation of SMD circuits to periodically generate test signals and collect a response of tested surge protection components and evaluate components characteristics status;

wherein the test signals are generated by step-up DC-DC converters which generate test signals at its multiplexed outputs to inputs under control from embedded microcontroller via digital interfaces;

the mix-signal digital and analog implementation of SMD circuits to respond instantaneously to a fault condition induced by an electromagnetic transient surge and to display an operational status of the SPDs, to provide embedded persistent status monitoring and displaying using strictly analog circuits comprising identical status monitoring subcircuits for each power line and a status indication circuit to provide local visual display of normal operational status and to indicate a fault condition status with an on-board local audio alarm and visual display comprising a light indication for each power line that visually provides a first indication for normal operational status and a second indication, using different light color, that visually displays and audibly indicates that a thermal fuse has melted and providing a voltage level output to an interface input of an embedded logical module;

the interface input of the embedded logical module comprising a single connection for a DC power line, two L1 and L2 connections for a split-phase AC power line, and three Ph1, Ph2, and Ph3 connections, respectively, for each of the subcircuits and the status indication circuit;

the embedded microcontroller in communication with the embedded logical module with digital input and output interface to monitor a plurality of voltage level connection lines and analog-to-digital converters for monitoring analog signals indicating operational status of SPD components;

an on-board data collection, temporary storage, and digital signal processing module with implemented machine learning and artificial intelligence (ML/AI) algorithm for status analysis and nonlinear component degradation predictive analytics;

a cybersecure communication channel using analog transmitter and receiver circuits for over-the-power-lines communication (OPLC) or fiberoptic communication channel with transmit-only mode of operation; and wherein at least one analog circuit provides a voltage zero-crossing detection on an AC power line, and triggers an analog gate to enable short-burst high-frequency pulse generation at voltage zero-crossing on the AC power line for over-the-power-lines communication (OPLC).

19. The system for persistent status monitoring and displaying as in claim 18, wherein collected operational status data and the ML/AI algorithm is configured and used for preventive maintenance of the SPDs.

* * * * *